(12) United States Patent
Tanaka

(10) Patent No.: US 7,649,698 B2
(45) Date of Patent: *Jan. 19, 2010

(54) LASER LIGHT IRRADIATION APPARATUS AND LASER LIGHT IRRADIATION METHOD

(75) Inventor: Koichiro Tanaka, Kanagawa (JP)

(73) Assignee: Semiconductor Energy Laboratory Co., Ltd., Atsugi-shi, Kanagawa-Ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/048,419

(22) Filed: Mar. 14, 2008

(65) Prior Publication Data

US 2008/0165822 A1    Jul. 10, 2008

Related U.S. Application Data

(63) Continuation of application No. 11/646,354, filed on Dec. 28, 2006, now Pat. No. 7,352,789.

(30) Foreign Application Priority Data

Jan. 12, 2006    (JP)    .............................. 2006-005210

(51) Int. Cl.
*G02B 13/18*    (2006.01)
(52) U.S. Cl. ............................. 359/719; 372/68; 372/75
(58) Field of Classification Search ................. 359/717; 372/69–72, 68, 75, 92, 101
See application file for complete search history.

(56) References Cited

U.S. PATENT DOCUMENTS

| 4,942,586 A | 7/1990 | Lai |
| 5,225,924 A | 7/1993 | Ogawa et al. |
| 5,537,258 A | 7/1996 | Yamazaki et al. |
| 5,617,243 A | 4/1997 | Yamazaki et al. |
| 5,815,494 A | 9/1998 | Yamazaki et al. |
| 6,097,421 A * | 8/2000 | Takeshita et al. ............ 347/258 |
| 6,373,870 B1 | 4/2002 | Yamazaki et al. |
| 6,426,840 B1 | 7/2002 | Partanen et al. |

(Continued)

FOREIGN PATENT DOCUMENTS

DE    10144244 A1    3/2003

(Continued)

OTHER PUBLICATIONS

Search Report issued May 2, 2007 in counterpart European Patent Application No. 07000062.5.

*Primary Examiner*—Timothy J Thompson
(74) *Attorney, Agent, or Firm*—Nixon Peabody, LLP; Jeffrey L. Costellia

(57) ABSTRACT

Laser light is emitted from a laser oscillator, and the laser light is made to enter a beam expander optical system including a concave lens through a correction lens. The laser oscillator, the correction lens and the concave lens are disposed so that, when an emission point of the laser oscillator is a first conjugate point, a point at which an image at the first conjugate point is formed through the correction lens is a second conjugate point, a distance between the correction lens and the second conjugate point is b, a focal length of the concave lens is f, and a distance between the correction lens and the concave lens is X, the X satisfies $b-3|f| \leq X \leq b+|f|$.

36 Claims, 15 Drawing Sheets

U.S. PATENT DOCUMENTS

| | | |
|---|---|---|
| 6,558,991 B2 | 5/2003 | Yamazaki et al. |
| 7,050,878 B2 | 5/2006 | Yamazaki et al. |
| 7,138,306 B2 | 11/2006 | Tanaka et al. |
| 7,352,789 B2 * | 4/2008 | Tanaka ........................ 372/68 |
| 2003/0058916 A1 | 3/2003 | Tanaka et al. |
| 2004/0257669 A1 | 12/2004 | Koehler |
| 2005/0111497 A1 | 5/2005 | Tanaka |
| 2006/0119949 A1 | 6/2006 | Tanaka et al. |

FOREIGN PATENT DOCUMENTS

| | | |
|---|---|---|
| EP | 0627643 A2 | 12/1994 |
| JP | 07-041845 | 2/1995 |

* cited by examiner

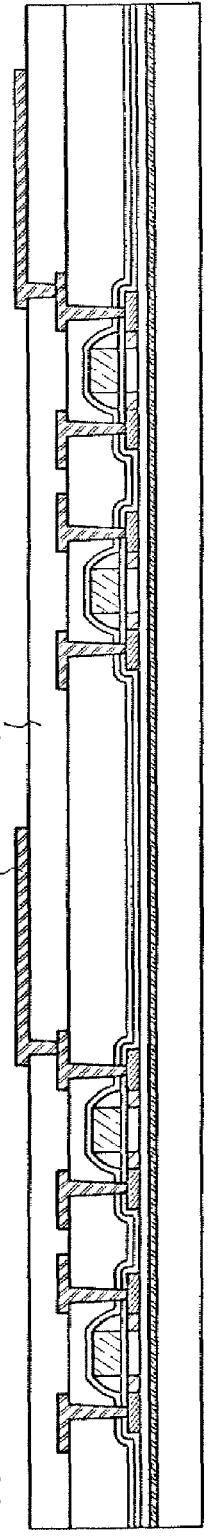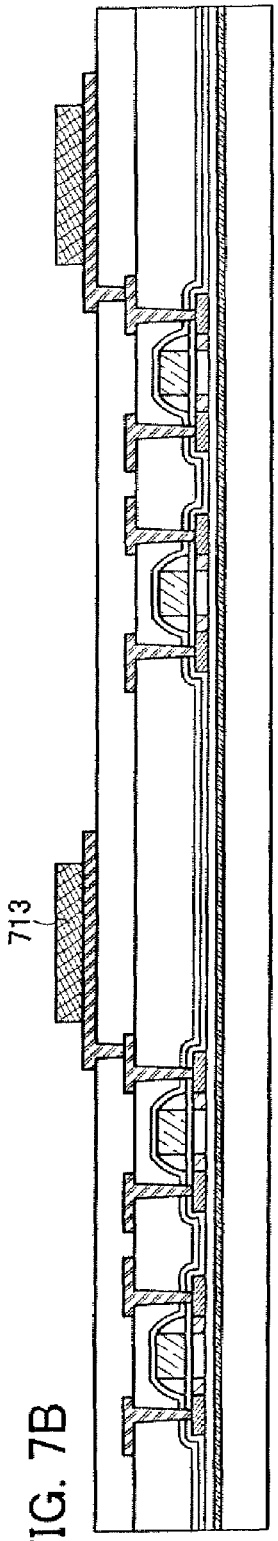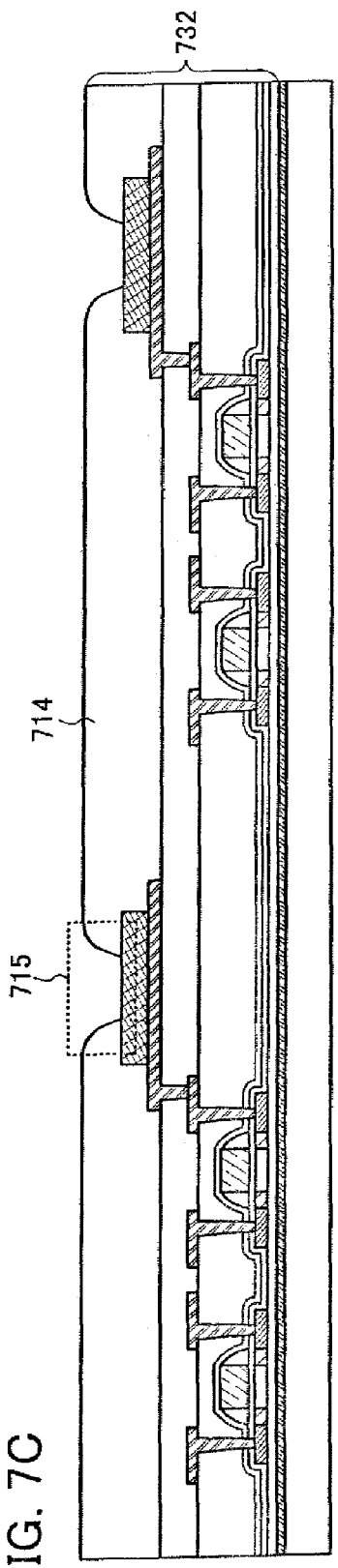

716

717

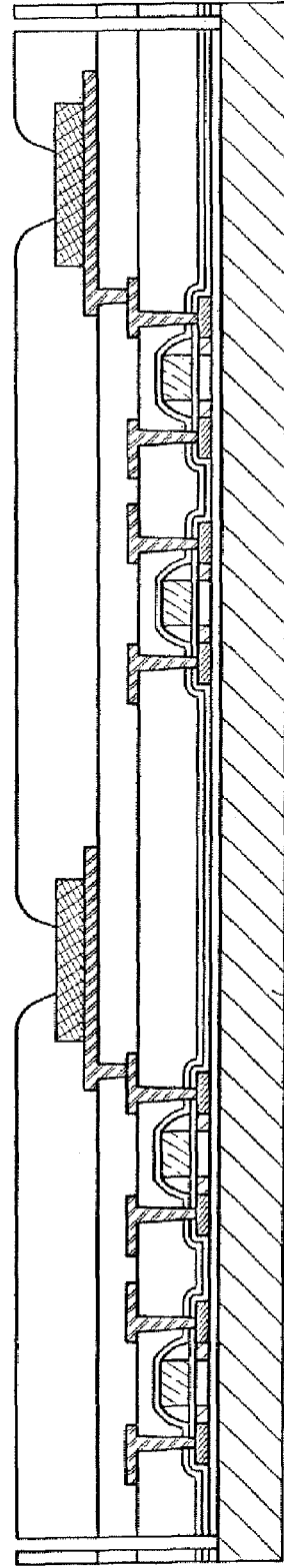
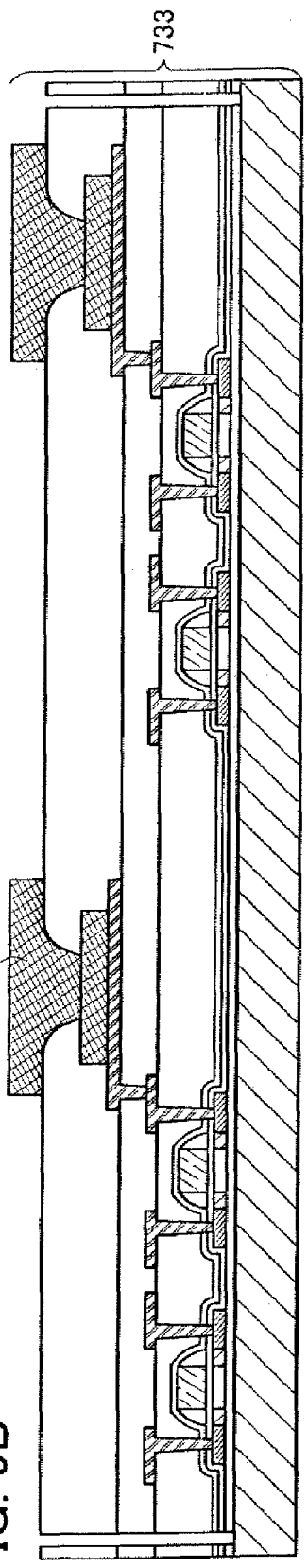
FIG. 9A
FIG. 9B

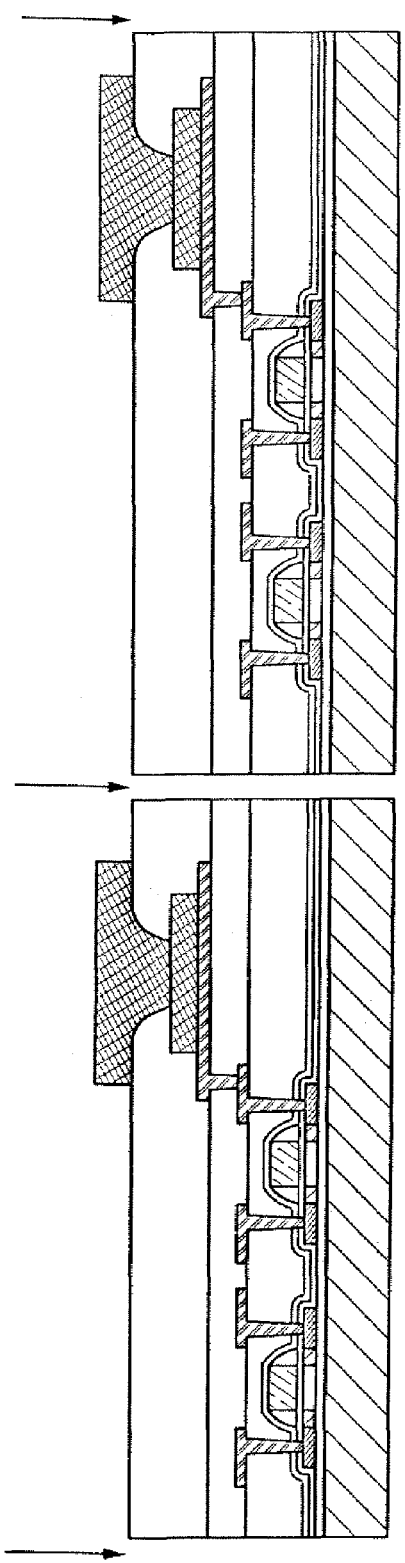
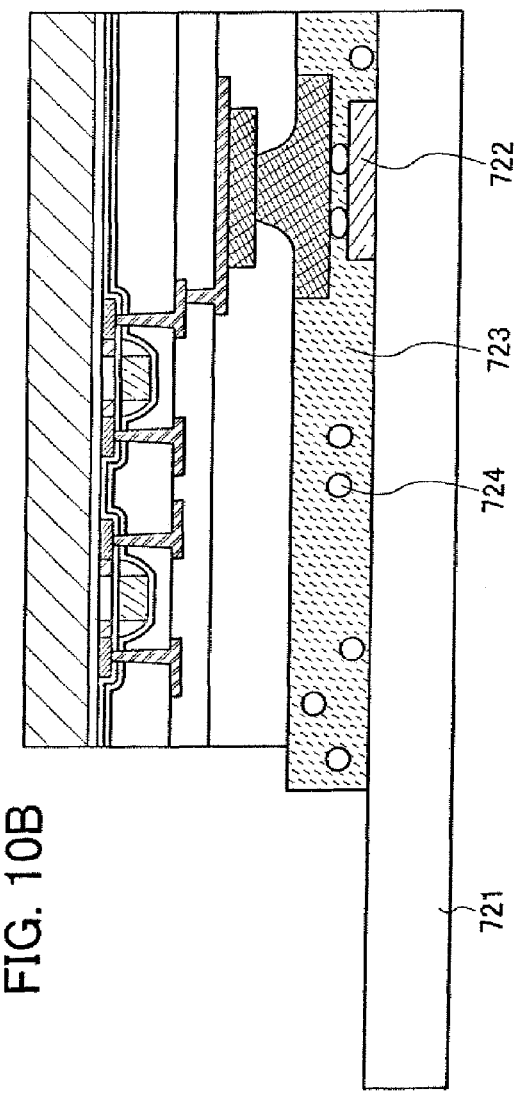
FIG. 10A
FIG. 10B

LASER LIGHT IRRADIATION APPARATUS AND LASER LIGHT IRRADIATION METHOD

BACKGROUND OF THE INVENTION

1. Field of the Invention

The present invention relates to a laser light irradiation apparatus and a laser light irradiation method, and particularly relates to a laser light irradiation apparatus and a laser light irradiation method using a beam expander optical system.

2. Description of the Related Art

Recently, a technique for manufacturing a thin film transistor (hereinafter referred to as a TFT) over a substrate has been drastically advanced and developed for being applied to an active matrix display device. In particular, a TFT using a polycrystalline semiconductor film has a higher electron field-effect mobility (also referred to as a mobility) than a conventional TFT using an amorphous semiconductor film; accordingly, high-speed operation is possible. Therefore, although the control of a pixel has been conventionally carried out by a driver circuit which is provided outside a substrate, the control can be carried out by a driver circuit which is formed over the same substrate as the one over which a pixel is formed.

As a substrate used for a semiconductor device, a glass substrate is expected more than a quartz substrate and a single-crystalline semiconductor substrate in terms of cost. The glass substrate has poor heat resistance and is easily deformed by heat. Therefore, when a semiconductor film is crystallized in order to form a TFT using a polycrystalline semiconductor film over a glass substrate, a method for crystallizing a semiconductor film by being irradiated with a laser beam is often used to avoid thermal deformation of the glass substrate.

Features of the crystallization of a semiconductor film by laser light are that, compared with an annealing method utilizing radiation heating or conductive heating, processing time can be drastically reduced, a semiconductor substrate or a semiconductor film over a substrate is selectively or locally heated so that the substrate is hardly thermal-damaged, and the like.

Generally, laser light oscillated from a laser oscillator has a Gaussian spatial intensity distribution. Therefore, in the case where an irradiation object is directly irradiated with laser light oscillated from a laser oscillator, the energy distribution varies in an irradiated region. For example, when crystallization or improvement of film quality is conducted by irradiating a semiconductor film of silicon or the like with laser light, if the semiconductor film is directly irradiated with laser light having a Gaussian spatial intensity distribution, in a central portion and an edge portion of an irradiated region, the energy distribution is different so that melt time of the semiconductor film varies. Consequently, crystallinity of the semiconductor film becomes nonuniform, and a semiconductor film having a desired characteristic cannot be obtained.

Accordingly, in general, after the spatial intensity distribution of laser light oscillated from a laser oscillator is uniformed by using some kind of laser light shaping means, an irradiation object is irradiated with the laser light. For example, as the laser light shaping means, a beam expander optical system is widely used (for example. Reference 1: Japanese Published Patent Application No. H7-41845).

SUMMARY OF THE INVENTION

However, an optical path of laser light changes depending on a laser oscillator itself or the state of use environment such as temperature change. Therefore, in the case, for example, where unstable laser light enters a beam expander optical system, an error of an incidence position of the laser light to the beam expander optical system causes displacement of an irradiation position of the laser light to an irradiation object by the same ratio as a magnification ratio of the laser light.

For example, when laser light is propagated to an irradiation object 503 through a beam expander optical system 502 of 25 magnifications, an incidence error of laser light 504 oscillated from a laser oscillator 501 to the beam expander optical system 502 increases 25-fold which is the same as the magnification ratio of the beam expander optical system 502, after the laser light passes through the beam expander optical system 502 (FIG. 5).

In consideration of the above-described problem, it is an object of the present invention to provide a laser light irradiation apparatus and a laser light irradiation method which reduce an error of an irradiation position of laser light to an irradiation object when the irradiation object is irradiated with the laser light through a beam expander optical system.

One feature of a laser light irradiation apparatus of the present invention is to include a laser oscillator; a beam expander optical system which laser light oscillated from the laser oscillator enters; and a correction lens disposed between the laser oscillator and the beam expander optical system, in which the beam expander optical system includes a concave lens at an entrance, and when an emission point (or a beam waist or a light source) of the laser oscillator is a first conjugate point, a point at which an image at the first conjugate point is formed through the correction lens is a second conjugate point, a distance between the correction lens and the second conjugate point is b, a focal length of the concave lens is f, and a distance between the correction lens and the concave lens is X, the X satisfies b−3|f|≦X≦b+|f|. Note that a concave lens used in this specification may be any optical element as far as it has a similar function to a concave lens.

One feature of a laser light irradiation apparatus of the present invention is to include a laser oscillator; a beam expander optical system which laser light oscillated from the laser oscillator enters; a diffractive optical element which the laser light having passed through the beam expander optical system enters; and a correction lens disposed between the laser oscillator and the beam expander optical system, in which the beam expander optical system includes a concave lens and a convex lens provided in order in a traveling direction of the laser light, and when an emission point of the laser oscillator is a first conjugate point, a point at which an image at the first conjugate point is formed through the correction lens is a second conjugate point, a distance between the correction lens and the second conjugate point is b, a focal length of the concave lens is f, and a distance between the correction lens and the concave lens is X, the X satisfies b−3|f|≦X≦b+|f|. Note that a convex lens used in this specification may be any optical element as far as it has a similar function to a convex lens.

In addition, one feature of the laser light irradiation apparatus of the present invention is that in the above-described structure, the X preferably and satisfies approximately X=b−|f|.

In addition, one feature of the laser light irradiation apparatus of the present invention is that, in the above-described structure, the distance between the laser oscillator and the concave lens is preferably 0.5 m or more, more preferably, 1 m or more.

One feature of a laser light irradiation apparatus of the present invention is to include a laser oscillator; a beam expander optical system which laser light oscillated from the laser oscillator enters; and a correction lens disposed between the laser oscillator and the beam expander optical system, in which the beam expander optical system includes a convex lens at an entrance, and when an emission point of the laser oscillator is a first conjugate point, a point at which an image at the first conjugate point is formed through the correction lens is a second conjugate point, a distance between the correction lens and the second conjugate point is b, a focal length of the convex lens is f and a distance between the correction lens and the convex lens is X, the X satisfies $b-|f| \leq X \leq b+3|f|$.

In addition, one feature of the laser light irradiation apparatus of the present invention is that, in the above-described structure, the distance between the laser oscillator and the convex lens is preferably 0.5 m or more, more preferably, 1 m or more.

One feature of a laser light irradiation apparatus of the present invention is to include a laser oscillator; a beam expander optical system which laser light oscillated from the laser oscillator enters; a diffractive optical element which the laser light having passed through the beam expander optical system enters; and a correction lens disposed between the laser oscillator and the beam expander optical system, in which the beam expander optical system includes a first convex lens and a second convex lens provided in order in a traveling direction of the laser light, and when an emission point of the laser oscillator is a first conjugate point, a point at which an image at the first conjugate point is formed through the correction lens is a second conjugate point, a distance between the correction lens and the second conjugate point is b, a focal length of the first convex lens is f, and a distance between the correction lens and the first convex lens is X, the X satisfies $b-|f| \leq X \leq b+3|f|$.

In addition, one feature of the laser light irradiation apparatus of the present invention is that in the above-described structure, the X preferably and satisfies approximately $X=b+|f|$.

In addition, one feature of the laser light irradiation apparatus of the present invention is that, in the above-described structure, the distance between the laser oscillator and the first convex lens is preferably 0.5 m or more, more preferably 1 m or more.

In addition, one feature of the laser light irradiation apparatus of the present invention is that in the above-described structure, the correction lens is a convex lens.

In the above-described structure, when a focal length of the correction lens is f and a distance between the first conjugate point and the correction lens is a, a, b and f have relation which satisfies $1/a+1/b \approx 1/f$.

One feature of a laser light irradiation method of the present invention is to include the steps of emitting laser light from a laser oscillator and making the laser light enter a beam expander optical system including a concave lens through a correction lens, in which the laser oscillator, the correction lens and the concave lens are disposed so that, when an emission point of the laser oscillator is a first conjugate point, a point at which an image at the first conjugate point is formed through the correction lens is a second conjugate point, a distance between the correction lens and the second conjugate point is b, a focal length of the concave lens is f, and a distance between the correction lens and the concave lens is X, the X satisfies $b-3|f| \leq X \leq b+|f|$.

One feature of a laser light irradiation method of the present invention is to include the steps of emitting laser light from a laser oscillator; making the laser light enter a beam expander optical system including a concave lens and a convex lens provided in order in a traveling direction of the laser light through a correction lens; and making the laser light having passed through the concave lens and the convex lens enter a diffractive optical element, in which the laser oscillator, the correction lens and the concave lens are disposed so that, when an emission point of the laser oscillator is a first conjugate point, a point at which an image at the first conjugate point is formed through the correction lens is a second conjugate point, a distance between the correction lens and the second conjugate point is b, a focal length of the concave lens is f, and a distance between the correction lens and the concave lens is X, the X satisfies $b-3|f| \leq X \leq b+|f|$.

In addition, one feature of the laser light irradiation method of the present invention is that, in the above-described structure, irradiation of the laser light is conducted with the laser oscillator, the correction lens and the concave lens disposed so that the X preferably and satisfies approximately $X=b-|f|$.

In addition, one feature of the laser light irradiation method of the present invention is that, in the above-described structure, irradiation of the laser light is conducted with a distance between the laser oscillator and the concave lens of, preferably, 0.5 m or more, more preferably, 1 m or more.

One feature of the laser light irradiation method of the present invention is to include the steps of emitting laser light from a laser oscillator and making the laser light enter a beam expander optical system including a convex lens through a correction lens, in which the laser oscillator, the correction lens and the convex lens are disposed so that, when an emission point of the laser oscillator is a first conjugate point, a point at which an image at the first conjugate point is formed through the correction lens is a second conjugate point, a distance between the correction lens and the second conjugate point is b, a focal length of the convex lens is f; and a distance between the correction lens and the convex lens is X, the X satisfies $b-|f| \leq X \leq b+3|f|$.

In addition, one feature of the laser light irradiation method of the present invention is that, in the above-described structure, irradiation of the laser light is conducted with a distance between the laser oscillator and the convex lens of preferably 0.5 m or more, and more preferably, 1 m or more.

One feature of a laser light irradiation method of the present invention is to include the steps of emitting laser light from a laser oscillator; making the laser light enter a beam expander optical system including a first convex lens and a second convex lens provided in order in a traveling direction of the laser light through a correction lens; and making the laser light having passed through the first convex lens and the second convex lens enter a diffractive optical element, in which the laser oscillator, the correction lens and the first convex lens are disposed so that, when an emission point of the laser oscillator is a first conjugate point, a point at which an image at the first conjugate point is formed through the correction lens is a second conjugate point, a distance between the correction lens and the second conjugate point is b, a focal length of the first convex lens is f, and a distance between the correction lens and the first convex lens is X, the X satisfies $b-|f| \leq X \leq b+3|f|$.

In addition, one feature of the laser light irradiation method of the present invention is that, in the above-described structure, irradiation of the laser light is conducted with the laser oscillator, the correction lens and the first convex lens disposed so that the X preferably and satisfies approximately X=b+|f|.

In addition, one feature of the laser light irradiation method of the present invention is that, in the above-described structure, irradiation of the laser light is conducted with a distance between the laser oscillator and the first convex lens of preferably 0.5 m or more, and more preferably, 1 m or more.

In addition, one feature of the laser light irradiation method of the present invention is that, in the above-described structure, a convex lens is used as the correction lens.

In the case where laser light oscillated from a laser oscillator has an increased scale by passing through a beam expander optical system and then enters an irradiation object, displacement of an incidence position of the laser light to the beam expander optical system can be reduced by providing a correction lens which corrects an optical path between the laser oscillator and the beam expander optical system. Consequently, displacement of an irradiation position of the laser light to the irradiation object can be reduced.

BRIEF DESCRIPTION OF DRAWINGS

In the accompanying drawings:

FIGS. 7A to 7C show an example of a manufacturing method of a semiconductor device, using a laser light irradiation apparatus of the present invention;

FIGS. 9A and 9B show an example of a manufacturing method of a semiconductor device, using a laser light irradiation apparatus of the present invention;

FIGS. 10A and 10B show an example of a manufacturing method of a semiconductor device, using a laser light irradiation apparatus of the present invention;

DETAILED DESCRIPTION OF THE INVENTION

Figure 1:
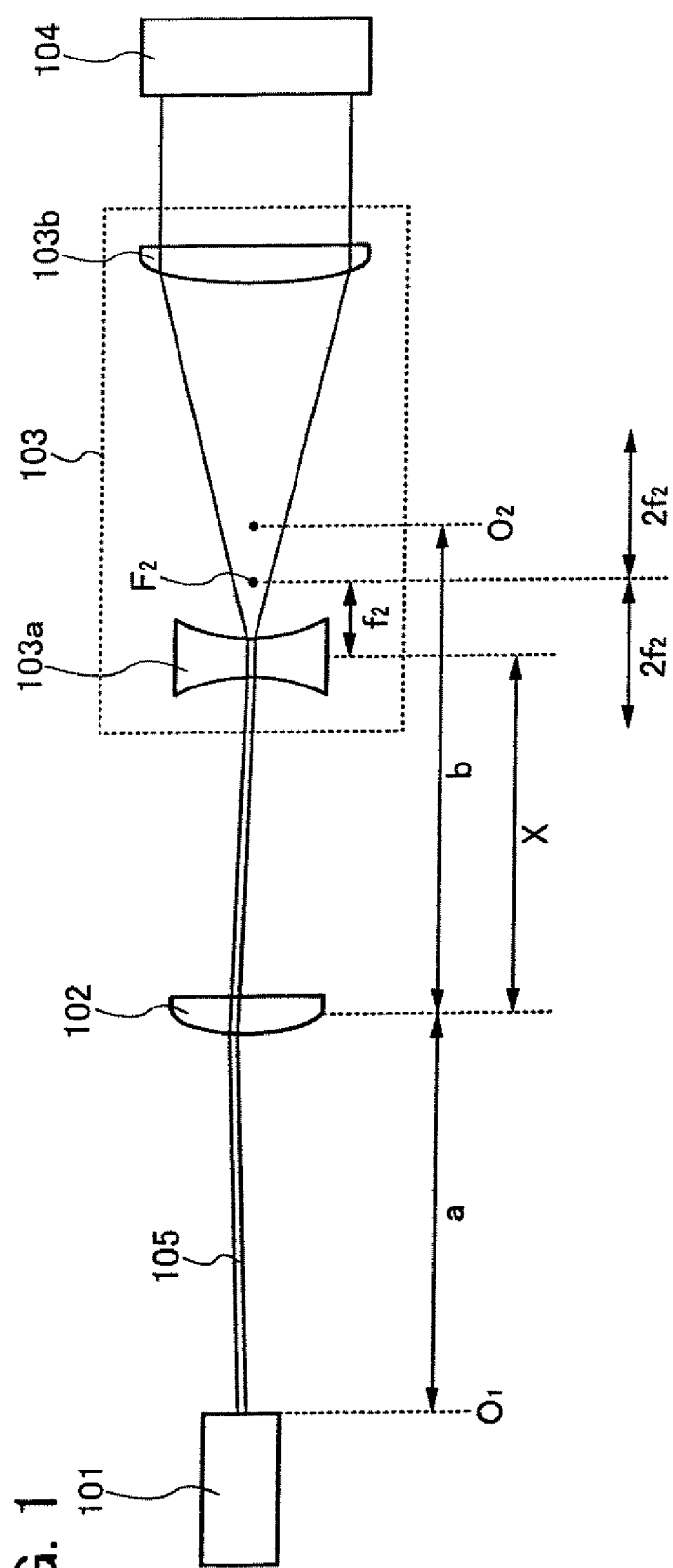
FIG. 1 shows an example of a laser light irradiation apparatus of the present invention.

Embodiment Modes and an embodiment of the present invention will be described with reference to the drawings.

Note that it is easily understood by those skilled in the art that the present invention is not limited to the following description and various changes may be made in forms and details without departing from the spirit and the scope of the invention. Therefore, the present invention should not be limited to the descriptions of the embodiment modes and the embodiment below. In addition, in a structure of the present invention described below, there is a case that the same reference numerals are commonly given to the same components or components having the same function.

Embodiment Mode 1

Embodiment Mode 1 will describe one example of a laser light irradiation apparatus and a laser light irradiation method of the present invention with reference to the drawings.

First FIG. 1 shows a structural example of a laser light irradiation apparatus described in this embodiment mode. The laser irradiation apparatus shown in FIG. 1 includes at least a laser oscillator 101, a correction lens 102 which corrects a light path, and a beam expander optical system 103. Laser light 105 oscillated from the laser oscillator 101 is propagated to the beam expander optical system 103 through the correction lens 102, and after the scale of the laser light 105 is increased by passing through the beam expander optical system 103, an irradiation object 104 is irradiated with the laser light 105 (FIG. 1).

As the beam expander optical system 103 in the laser light irradiation apparatus described in this embodiment mode, a concave lens and a convex lens can be combined. In FIG. 1, a concave lens 103a and a convex lens 103b are disposed in order in a traveling direction of the laser light 105 which is oscillated from the laser oscillator 101. Although FIG. 1 shows an example of using a biconcave lens as the concave lens 103a and using a plano-convex lens as the convex lens 103b, the invention is not limited to this; a plano-concave lens, a concave meniscus lens, or the like may also be used as the concave lens 103a, and a biconvex lens, a convex meniscus lens, or the like may also be used as the convex lens 103b.

As a laser capable of being used as the laser oscillator 101, a continuous-wave laser (CW laser) such as a $YVO_4$ laser, a quasi-CW laser, or the like can be used. For example, as a gas laser, there is an Ar laser, a Kr laser, a $CO_2$ laser, or the like, and as a solid-state laser, there is a YAG laser, a YLF laser; a $YAlO_3$ laser, a $GdVO_4$ laser, an alexandrite laser, a Ti:sapphire laser, a ceramics laser typified by a $Y_2O_3$ laser, or the like. As a metal vapor laser, there is a helium-cadmium laser or the like. Alternatively, a disk laser may also be used. A feature of the disk laser is that cooling efficiency is excellent because a laser medium has a disk shape, namely, energy efficiency and beam quality are excellent.

Laser light emitted from the above-described laser oscillator is preferably oscillated in $TEM_{00}$ so that a linear beam spot obtained at an irradiated surface can have higher uniformity of energy.

Even in the case where the incident angle of the laser light to the beam expander optical system 103 is changed, if the laser light enters an optimal position of the beam expander optical system 103, the laser light is expanded and propagated from a certain position and angle to the next irradiation surface (here, the irradiation object 104). That is, the incidence position of the laser light to the beam expander optical system 103 is more important than the incident angle.

Therefore, the correction lens 102 is disposed between the laser oscillator 101 and the beam expander optical system 103 in order to keep the incidence position fixed. Thus, by propagating the laser light oscillated from the laser oscillator 101 to the beam expander optical system 103 through the correction lens 102, unstable laser light can enter a right position of the beam expander optical system 103, and further, it becomes possible to propagate the laser light also to a right position on a surface of the irradiation object 104. That is, the correction lens 102 is provided here for controlling the incidence position of the laser light which enters the concave lens 103a for forming the beam expander optical system 103.

The laser light having passed through the beam expander optical system 103 is propagated to the irradiation object 104. As the irradiation object 104, for example, a diffractive optical element can be used. The diffractive optical element is also called a diffractive optics or a diffractive optics element, which is an element for obtaining a spectrum by utilizing diffraction of light. Since the diffractive optical element is an element having a minute and complicated structure, it is necessary that laser light is made to enter from an extremely right position. Generally, a diameter of the diffractive optical element is very difficult to be reduced at present, and a method in which laser light is expanded by a beam expander optical system or the like to be propagated to the diffractive optical element, is applied as a use method of the diffractive optical element. Accordingly, in the case where a beam expander optical system and a diffractive optical element are provided in combination, it is very effective to provide the correction lens 102 between the laser oscillator 101 and the beam expander optical system 103 as described above, so as to reduce displacement of the incidence position of the laser light to the diffractive optical element.

As the correction lens 102, a convex lens which condenses incident light can be used. Although the example of using a plano-convex lens as the correction lens 102 is shown in FIG. 1, a biconvex lens, a convex meniscus lens, or the like can be alternatively used. Alternatively, a cylindrical lens may also be used. The cylindrical lens is a lens which has a curvature in one direction and can condense or expand laser light only in a one-dimensional direction. Accordingly, by providing a plurality of cylindrical lenses in combination and combining curvature directions of the cylindrical lenses, optical adjustment can be freely conducted.

Further, in the laser light irradiation apparatus described in this embodiment mode, in the case where the laser light oscillated from the laser oscillator 101 enters the concave lens 303a through the correction lens 102, when an emission point (or a beam waist or a light source) of the laser oscillator 101 is a first conjugate point $O_1$, a point at which an image at the first conjugate point $O_1$ is formed through the correction lens 102 is a second conjugate point $O_2$, a distance between the first conjugate point $O_1$ and the correction lens 102 is a, a distance between the correction lens 102 and the second conjugate point $O_2$ is b, a focal length of the concave lens 103a is $f_2$, and a distance between the correction lens 102 and the concave lens 103a is X, the concave lens 303a is disposed so as to satisfy the following relation:

$$b-3|f_2| \leq X \leq b+|f_2|.$$

This satisfies, when a focal point of the concave lens 103a (here, a focal point of the concave lens 103a located on the traveling direction side of the laser light) is denoted by $F_2$, the relation that the second conjugate point $O_2$ is located in a range of $2f_2$ in the traveling direction of the laser light and the direction opposite to the traveling direction from the focal point $F_2$ of the concave lens 103a. By disposing the laser oscillator 101, the correction lens 102, the concave lens 103a, and the like so that X satisfies such a relation, an incidence error of the laser light to the beam expander optical system can be reduced, and an error of the irradiation position of the laser light to the irradiation object 104 can be reduced.

Figure 2:
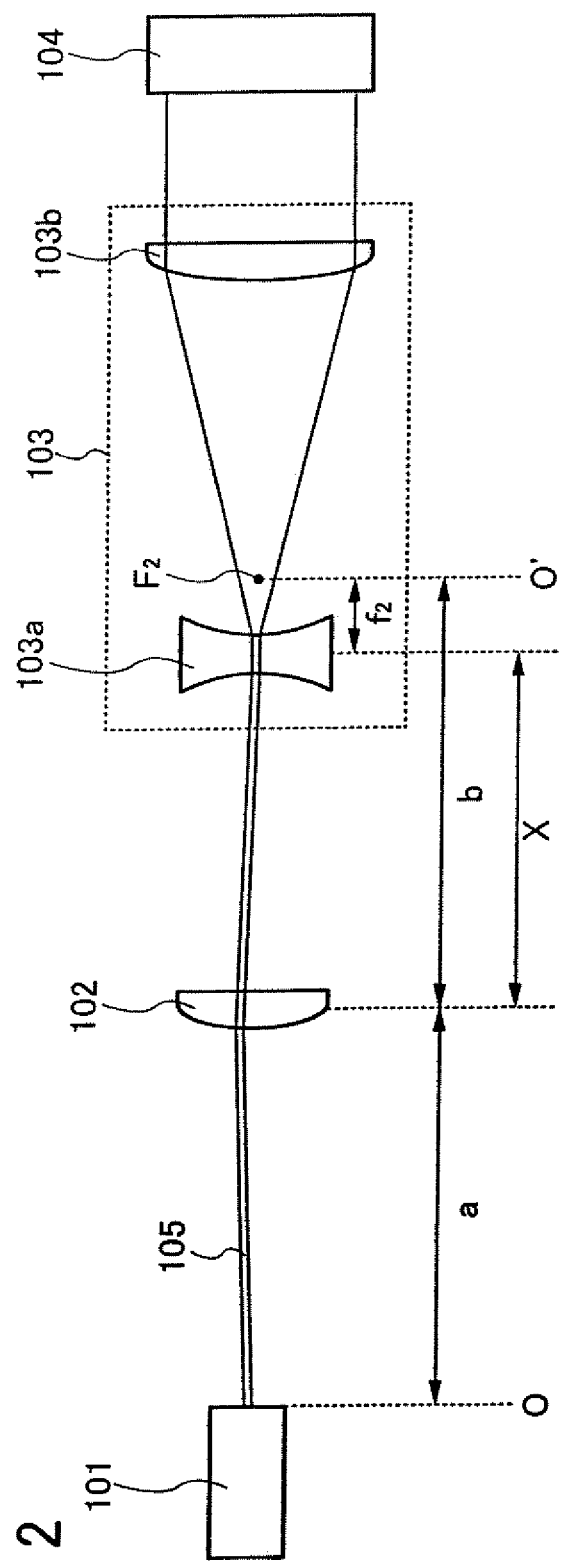
FIG. 2 shows an example of a laser light irradiation apparatus of the present invention.

Preferably, the concave lens 103a may be disposed so that X which determines the position of the concave lens 103a satisfies the relation: $X=b-|f_2|$ (FIG. 2). That is, the concave lens 103a is provided so as to form the second conjugate point $O_2$ at a position which becomes the focal point $F_2$ of the concave lens 103a Where, the focal point of the concave lens 103a located on the traveling direction side of the laser light). In this case, when laser light irradiation is conducted to an irradiation object through a beam expander, an error of the irradiation position of the laser light to the irradiation object can be minimized. This disposition can most effectively balance out the action of the concave lens 103a for widening a beam toward the outside and the action of the convex lens 103b for focusing the laser light toward the inside, and can suppress variation of the laser light emitted from the beam expander optical system 103.

In addition, when a focal length of the correction lens 102 is $f_1$, a distance between the first conjugate point $O_1$ and the correction lens 102 is a, and a distance between the correction lens 102 and the second conjugate point $O_2$ is b, the focal length $f_1$ of the correction lens 102 satisfies the relation: $1/a+1/b \approx 1/f_1$.

The laser light irradiation apparatus or the laser light irradiation method described in this embodiment mode is more effective as the distance between the laser oscillator 101 and the beam expander optical system 103 is increased. Generally, in the case of disposing optical systems, it is necessary to provide the optical systems with a certain distance therebetween in view of the apparatus. Accordingly, the laser light irradiation apparatus described in this embodiment mode is particularly effective when the distance between the laser oscillator 101 and the concave lens 103a for forming the beam expander optical system 103 is preferably 0.5 m or more, more preferably 1 m or more.

This embodiment mode can be applied to all laser light irradiation apparatuses and laser light irradiation methods which use a beam expander optical system.

Embodiment Mode 2

Embodiment Mode 2 will describe a laser light irradiation apparatus and a laser light irradiation method, which are different from those in the above-described embodiment mode, with reference to the drawing. Specifically, the case of using a beam expander optical system including a first convex lens and a second convex lens will be described.

Figure 3:
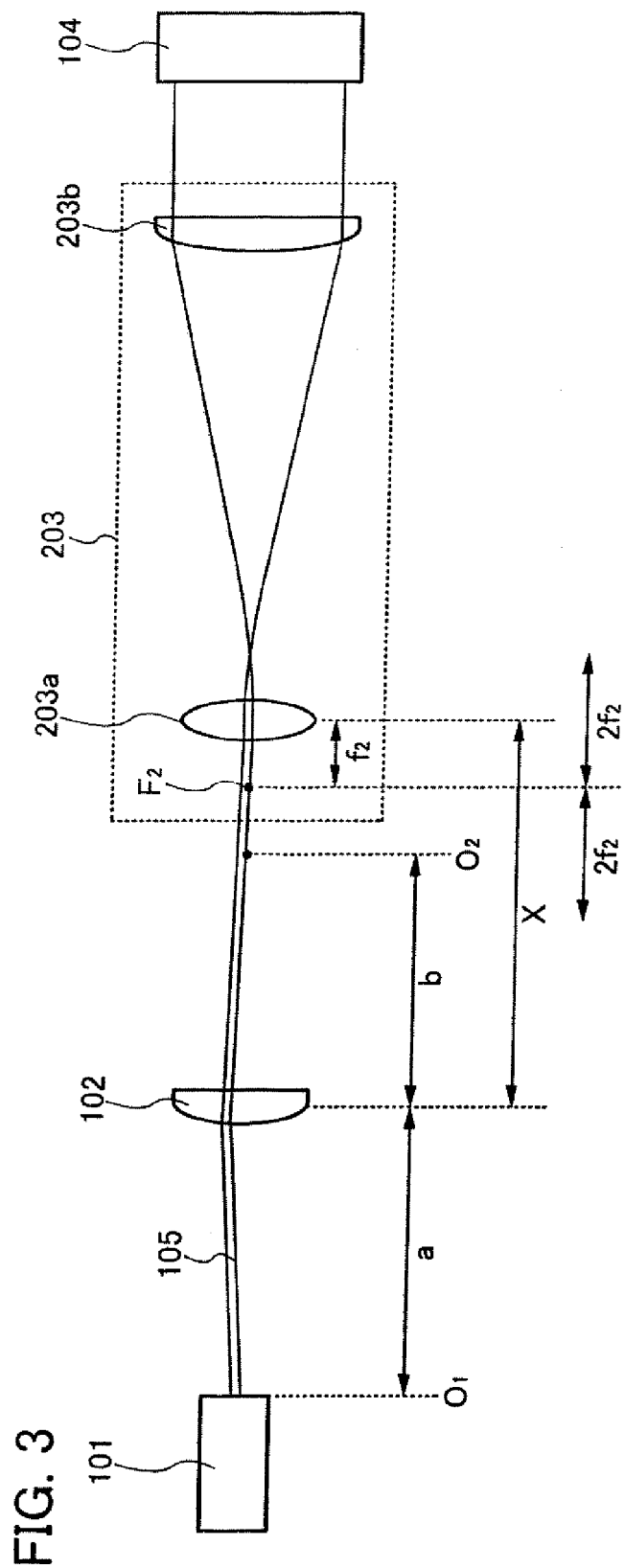
FIG. 3 shows an example of a laser light irradiation apparatus of the present invention.

One structural example of the laser light irradiation apparatus described in this embodiment mode is shown in FIG. 3. The laser irradiation apparatus shown in FIG. 3 includes at least a laser oscillator 101, a correction lens 102 and a beam expander optical system 203. Laser light 105 oscillated from the laser oscillator 101 is propagated to the beam expander optical system 203 through the correction lens 102 which corrects a light path, and after the scale of the laser light is increased by the beam expander optical system 203, an irradiation object 104 is irradiated with the laser light (FIG. 3).

As the beam expander optical system 203, a first convex lens and a second convex lens can be provided in combination. In FIG. 3, a first convex lens 203a and a second convex lens 203b are disposed in order in a traveling direction of the laser light 105 which is oscillated from the laser oscillator 101. Although plano-convex lenses are used as the first convex lens 203a and the second convex lens 203b here, the invention is not limited to this; a biconvex lens, a convex meniscus lens, or the like may also be used. It is needless to say that different types of convex lenses may be used as the first convex lens 203a and the second convex lens 203b.

Even in the case where the incident angle of the laser light to the beam expander optical system 203 is changed, if the laser light enters an optimal position of the beam expander optical system 203, the laser light is expanded and propagated from a certain position and angle to the next irradiation surface (here, the irradiation object 104). The correction lens 102 is disposed between the laser oscillator 101 and the beam expander optical system 203 in order to keep the incidence position fixed. Thus, by propagating the laser light oscillated from the laser oscillator 101 to the beam expander optical system 203 through the correction lens 102, unstable laser light can enter a right position of the beam expander optical system 203, and further, it becomes possible to propagate the laser light also to a right position on a surface of the irradiation object 104. That is, the correction lens 102 is provided here for controlling the incidence position of the laser light to the first convex lens 203a for forming the beam expander optical system 203.

The laser light having passed through the beam expander optical system 203 is propagated to the irradiation object 104 and diffracted into a desired shape. As the irradiation object 104, for example, a diffractive optical element can be used. Generally, a diameter of the diffractive optical element is very difficult to be reduced at present, and a method in which laser light is expanded by a beam expander or the like to be propagated to the diffractive optical element, is applied as a use method of the diffractive optical element. Accordingly, by providing the correction lens 102 between the laser oscillator 101 and the beam expander optical system 203 as described above, displacement of the incidence position of the laser light to the irradiation object 104 (for example, diffractive optical element) can be reduced.

In the laser light irradiation apparatus described in this embodiment mode, in the case where the laser light oscillated from the laser oscillator 101 enters the first convex lens 203a through the correction lens 102, given that an emission point (or a beam W or a light source) of the laser oscillator 101 is a first conjugate point $O_1$, a point at which an image at the first conjugate point $O_1$ is formed through the correction lens 102 is a second conjugate point $O_2$, a distance between the first conjugate point $O_1$ and the correction lens 102 is a, a distance between the correction lens 102 and the second conjugate point $O_2$ is b, a focal length of the first convex lens 203a is $f_2$, and a distance between the correction lens 102 and the first convex lens 203a is X, the first convex lens 203a is disposed so as to satisfy the following relation:

$b - |f_2| \leq X \leq b + 3|f_2|$.

This satisfies, when a focal point of the first convex lens 203a (here, a focal point of the first convex lens 203a located on the opposite side of the traveling direction of the laser light) is denoted by $F_2$, the relation that the second conjugate point $O_2$ is located in a range of $2f_2$ in the traveling direction of the laser light and the direction opposite to the traveling direction from the focal point $F_2$ of the first convex lens 203a By disposing the laser oscillator 101, the correction lens 102, the first convex lens 203a, and the like so that X satisfies such a relation, an incidence error of the laser light to the beam expander optical system can be reduced, and an error of the irradiation position of the laser light to the irradiation object 104 can be reduced.

Preferably, the first convex lens 203a may be provided so that X which determines the position of the first convex lens 203a satisfies the relation: $X = b + |f_2|$. That is, the first convex lens 203a is provided so as to form the second conjugate point $O_2$ at a position which becomes the focal point $F_2$ of the first convex lens 203a (here, the focal point of the first convex lens 203a located on the traveling direction side of the laser light). In this case, when laser light irradiation is conducted to the irradiation object 104 through the beam expander optical system 203, an error of the irradiation position of the laser light to the irradiation object 104 can be minimized. This disposition can most effectively balance out the action of the first convex lens 203a for returning laser light, which tends to deviate to the outer side of the center of the lens, to the center side of the lens and the action of the second convex lens 203b for suppressing the laser light which is returned to the center side of the lens by the first convex lens 203a from deviating to the outer side again, and can effectively suppress variation of the laser light emitted from the beam expander optical system 203.

In addition, given that a focal length of the correction lens 102 is $f_1$, a distance between the first conjugate point $O_1$ and the correction lens 102 is a, and a distance between the correction lens 102 and the second conjugate point $O_2$ is b, the focal length $f_1$ of the correction lens 102 satisfies the relation: $1/a + 1/b \approx 1/f_1$.

The laser light irradiation apparatus or the laser light irradiation method described in this embodiment mode is more effective as the distance between the laser oscillator 101 and the beam expander optical system 203 is increased. Generally, in the case of disposing optical systems, it is necessary to provide the optical systems with a certain distance therebetween in view of the apparatus. Accordingly, the laser light irradiation apparatus described in this embodiment mode is particularly effective when the distance between the laser oscillator 101 and the first convex lens 203a for forming the beam expander optical system 203 is preferably 0.5 m or more, more preferably 1 m or more.

Embodiment Mode 3

Embodiment Mode 3 will describe a manufacturing method of a semiconductor device which uses the laser light irradiation apparatus or the laser light irradiation method described in the above-described embodiment modes, with reference to the drawings.

Figure 6A:
FIGS. 6A to 6D show an example of a manufacturing method of a semiconductor device, using a laser light irradiation apparatus of the present invention.

First, a peeling layer 702 is formed over a surface of a substrate 701, and sequentially, an insulating film 703 to be a base and an amorphous semiconductor film 704 (a film containing amorphous silicon, for example) are formed (FIG. 6A). It is to be noted that the peeling layer 702, the insulating film 703, and the amorphous semiconductor film 704 can be formed sequentially.

As the substrate 701, a glass substrate, a quartz substrate, a metal substrate, or a stainless steel substrate, with an insulating film formed over a surface thereof, a plastic substrate having heat resistance against the treatment temperature of this step, or the like may be used. With such a substrate 701, an area and a shape thereof are not particularly restricted; therefore, by using a rectangular substrate with at least one meter on a side as the substrate 701, for example, the productivity can be drastically improved. Such merit is greatly advantageous as compared to a case of using a circular silicon substrate. It is to be noted that, the peeling layer 702 is formed over an entire surface of the substrate 701 in this step; however, the peeling layer 702 may be selectively formed as needed using a photolithography method after the peeling layer is formed over the entire surface of the substrate 701. In addition, the peeling layer 702 is formed so as to be in contact with the substrate 701; however, an insulating film may be formed as a base to be in contact with the substrate 701 as needed, and the peeling layer 702 may be formed so as to be in contact with the insulating film.

As the peeling layer 702, a metal film, a stacked layer structure of a metal film and a metal oxide film, or the like can be used. The metal film is formed as a single layer or stacked layers of a film formed of an element selected from tungsten (W), molybdenum (Mo), titanium (Ti), tantalum (Ta), niobium (N), nickel (Ni), cobalt (Co), zirconium (Zr), zinc (Zn), ruthenium (Ru), rhodium (Rh), palladium (Pd), osmium (Os), or iridium (Ir), or an alloy material or a compound material containing the above-described element as its main component. The metal film can be formed by a sputtering method, various CVD methods such as a plasma CVD method or the like, using these materials. As the stacked layer structure of a metal film and a metal oxide film, after the above-described metal film is formed, an oxide or oxynitride of the metal film can be formed on the metal film surface by performing plasma treatment in an oxygen atmosphere or an $N_2O$ atmosphere, or heat treatment in an oxygen atmosphere or an $N_2O$ atmosphere. For example, in a case where a tungsten film is formed by a sputtering method, a CVD method, or the like as the metal film, a metal oxide film of tungsten oxide can be formed on the tungsten film surface by performing plasma treatment on the tungsten film. In this case, an oxide of tungsten is expressed by $WO_x$, and $x$ is 2 to 3. There are cases of x=2 ($WO_2$), x=2.5 ($W_2O_5$), x=2.75 ($W_4O_{11}$), x=3 ($WO_3$), and the like. When forming an oxide of tungsten, the value of x described above is not particularly restricted, and which oxide is to be formed may be decided based on an etching rate or the like. Alternatively, for example, a metal film (such as tungsten) is formed and then an insulating film of silicon oxide ($SiO_2$) or the like is formed over the metal film by a sputtering method, and a metal oxide may be formed over the metal film (for example, tungsten oxide over tungsten). In addition, as plasma treatment, the above-described high-density plasma treatment may be performed, for example. In addition, other than the metal oxide film, a metal nitride or a metal oxynitride may also be used. In this case, the metal film may be subjected to the plasma treatment or the heat treatment in a nitrogen atmosphere or an atmosphere of nitrogen and oxygen.

As the insulating film 703, a single layer or stacked layers of a film containing an oxide of silicon or a nitride of silicon is/are formed by a sputtering method, a plasma CVD method or the like. In a case where the base insulating film employs a two-layer structure, a silicon nitride oxide film may be formed as a first layer, and a silicon oxynitride film may be formed as a second layer, for example. In a case where the base insulating film employs a three-layer structure, a silicon oxide film, a silicon nitride oxide film, and a silicon oxynitride film may be formed as a first insulating film, a second insulating film, and a third insulating film, respectively. Alternatively, a silicon oxynitride film, a silicon nitride oxide film, and a silicon oxynitride film may be formed as a first insulating film, a second insulating film, and a third insulating film, respectively. The base insulating film functions as a blocking film for preventing the entry of an impurity from the substrate 701.

The amorphous semiconductor film 704 is formed with a thickness of 25 to 200 nm (preferably 30 to 150 nm) by a sputtering method, an LPCVD method, a plasma CVD method or the like.

Figure 6B:

Next the amorphous semiconductor film 704 is crystallized by being irradiated with laser light. The amorphous semiconductor film 704 may be crystallized by a method or the like in which a laser irradiation method is combined with a thermal crystallization method using an RTA or an annealing furnace or a thermal crystallization method using a metal element for promoting crystallization. After that, the obtained crystalline semiconductor film is etched so as to have a desired shape; thereby forming crystalline semiconductor films 704a to 704d. Then, a gate insulating film 705 is formed so as to cover the crystalline semiconductor films 704a to 704d (FIG. 6B).

An example of a manufacturing step of the crystalline semiconductor films 704a to 704d will be briefly described below. First, an amorphous semiconductor film with a thickness of 50 to 60 nm is formed by a plasma CVD method. Next, a solution containing nickel that is a metal element for promoting crystallization is retained on the amorphous semiconductor film, and dehydrogenation treatment (at 500° C., for one hour) and thermal crystallization treatment (at 550° C., for four hours) are performed on the amorphous semiconductor film; thereby forming a crystalline semiconductor film. After that, the crystalline semiconductor film is irradiated with laser light, and a photolithography method is used, so that the crystalline semiconductor films 704a to 704d are formed. Note that without conducting the thermal crystallization which uses the metal element for promoting crystallization, the amorphous semiconductor film may be crystallized only by laser light irradiation.

Figure 4:
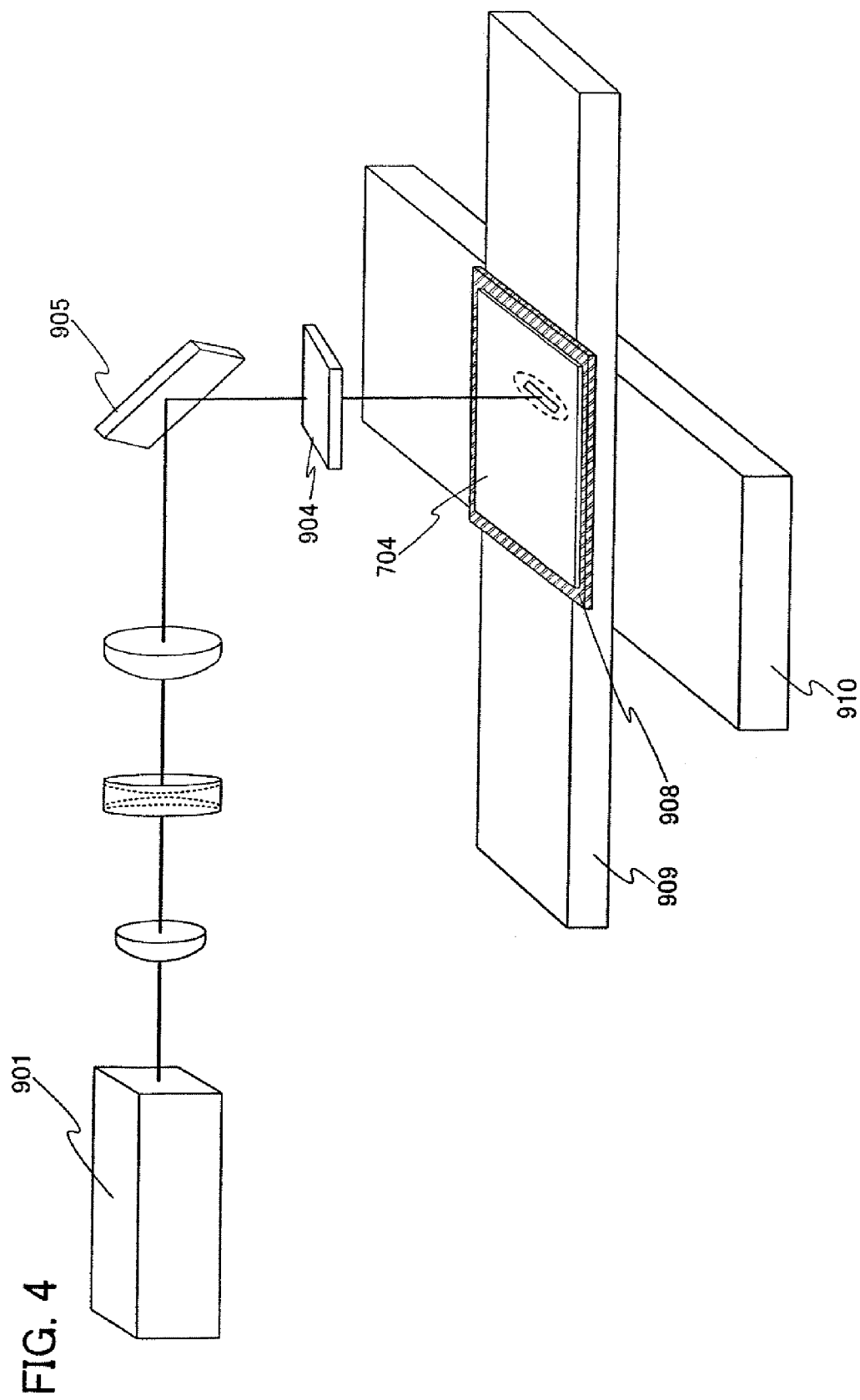
FIG. 4 shows an example of a laser light irradiation apparatus of the present invention.
Figure 5:
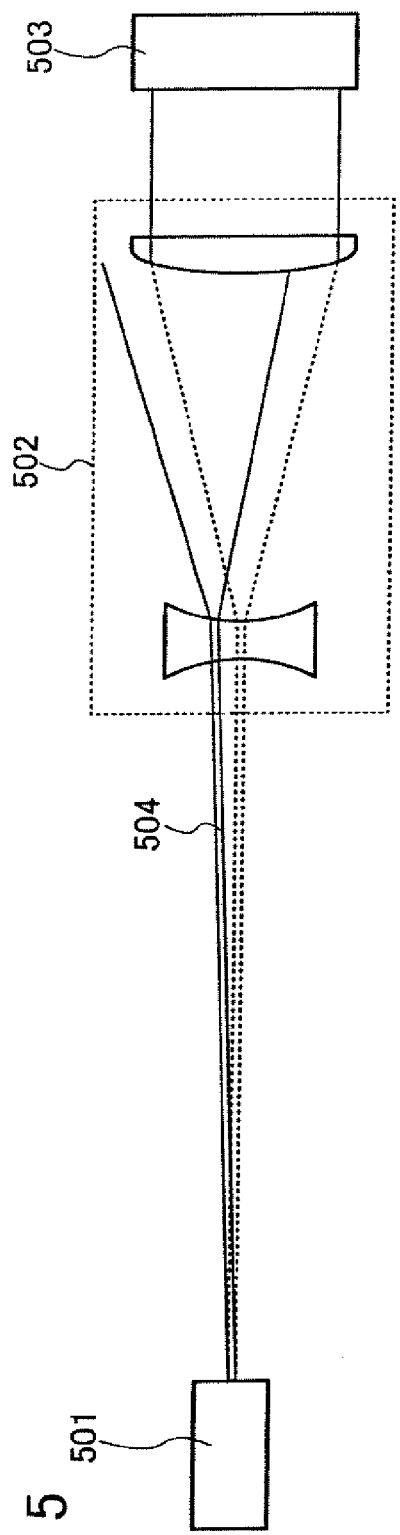
FIG. 5 shows an example of a conventional laser light irradiation apparatus.

Here, an example of a laser light irradiation apparatus and a laser light irradiation method used in laser light irradiation will be described (FIG. 4). The laser light irradiation apparatus shown in FIG. 4 includes a laser oscillator 901, a correction lens 902, a beam expander optical system 903 including a concave lens 903a and a convex lens 903b, a diffractive optical element 904, a mirror 905, a suction stage 908, an X stage 909, and a Y stage 910.

First, a substrate 701 provided with an amorphous semiconductor film 704 is prepared. The substrate 701 is fixed on the suction stage 908. The suction stage 908 can be moved freely in an X-axis direction and a Y-axis direction by using the X stage 909 and the Y stage 910. Note that the movement in the X-axis direction and the Y-axis direction can be performed by using various stages such as a motor stage, a ball bearing stage, or a linear motor stage.

Laser light oscillated from the laser oscillator 901 enters the beam expander optical system 903 through the correction lens 902, and then the scale of the laser light is processed to be larger by the beam expander optical system 903. After the laser light passes through the diffractive optical element 904, the amorphous semiconductor film 704 provided over the substrate 701 is irradiated with the laser beam.

As the laser oscillator 901, a continuous wave laser (a CW laser) or a pulsed wave laser (a pulsed laser) can be used. As a laser beam which can be used here, a laser beam emitted from one or more of the following can be used: a gas laser such as an Ar laser, a Kr laser or an excimer laser; a laser of which the medium is single crystalline YAG, $YVO_4$, forsterite ($Mg_2SiO_4$), $YAlO_3$, $GdVO_4$, or polycrystalline (Ceramic) YAG, $Y_2O_3$, $YVO_4$, $YAlO_3$, $GdVO_4$, each added with one or more of Nd, Yb, Cr, Ti, Ho, Er, Tm and Ta as a dopant; a glass laser; a ruby laser; an alexandrite laser; a Ti: sapphire laser; a copper vapor laser; or a gold vapor laser. It is possible to obtain crystals with a large grain size when fundamental waves of such laser beams or second to fourth harmonics of the fundamental waves are used. For example, the second harmonic (532 mm) or the third harmonic (355 nm) of an Nd: $YVO_4$ laser (fundamental wave of 1064 nm) can be used. In this case, an energy density of about 0.01 to 100 MW/cm$^2$ preferably, 0.1 to 10 MW/cm$^2$) is required. Irradiation is conducted with a scanning rate of about 10 to 2000 cm/sec. It is to be noted that, a laser using, as a medium, single crystalline YAG, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$ added with one or more of Nd, Yb, Cr, Ti, Ho, Er, Tm, and Ta as a dopant; an Ar ion laser; or a Ti: sapphire laser can be continuously oscillated. Furthermore, pulse oscillation thereof can be performed with a repetition rate of 10 MHz or more by carrying out Q switch operation, mode synchronization or the like. In the case where a laser beam is oscillated with a repetition rate of 10 MHz or more, after a semiconductor film is melted by a laser and before it is solidified, the semiconductor film is irradiated with a next pulse. Therefore, unlike a case of using a pulsed laser with a low repetition rate, a solid-liquid interface can be continuously moved in the semiconductor film, so that crystal grains which continuously grow in a scanning direction can be obtained.

The laser oscillator 901, the correction lens 902 and the concave lens 903*a* are disposed so as to satisfy the relation described in Embodiment Mode 1. By providing the correction Jens 902 between the laser oscillator 901 and the concave lens 903*a* in this manner, positional displacement of the laser light to enter the substrate 701 through the diffractive optical element 904 after passing through the beam expander optical system 903, can be reduced, and the irradiation position of the laser light can be precisely controlled.

As a typical example of the diffractive optical element 904, there is a holographic optical element, a binary optical element, or the like. The diffractive optical element 904 is also called a diffractive optics or a diffractive optics element, which is an element for obtaining a spectrum by utilizing diffraction of light. A diffractive optical element having a condenser lens function by being formed with a plurality of grooves on its surface is used as the diffractive optical element 904. Then, by using this diffractive optical element 904, the laser light emitted from the laser oscillator can be formed into a linear or rectangular beam with a uniform energy distribution.

The laser light irradiation apparatus capable of being used in this embodiment mode is not limited to the structure of FIG. 4. For example, in FIG. 4, a convex lens may be substituted for the concave lens 903*a* for forming the beam expander optical system 903. In this case, the laser oscillator 901, the correction lens 902 and the convex lens substituted for the concave lens 903*a* are disposed so as to satisfy the relation described in Embodiment Mode 2.

A condensing lens may be provided on the irradiation side of the diffractive optical element 904. For example, two cylindrical lenses can be used. In this case, laser light is made to perpendicularly enter the two cylindrical lenses. Since a cylindrical lens has a curvature in one direction, it is possible to condense or expand laser light only in a one-dimensional direction. Accordingly, by making the direction of a curvature of one of the two cylindrical lenses in an X-axis direction and making the direction of a curvature of the other of the two cylindrical lenses in a Y-axis direction, the size of a beam spot on an irradiation surface can be arbitrary changed in X and Y directions; accordingly, optical adjustment is easy and freedom of the adjustment is high. Alternatively, only in one direction the condensing or expanding of laser light may be performed by using one cylindrical lens. Further, in the case where condensing is performed with a length ratio of a major axis and a minor axis of an image formed by the diffractive optical element 904 kept, a spherical lens may be used instead of the cylindrical lens.

Note that in the laser light irradiation apparatus shown in FIG. 4, the distance between the laser oscillator 901 and the concave lens 903*a* is preferably 0.5 m or more, and more preferably 1 m or more in view of the apparatus.

By using the above-described laser light irradiation method in this manner, the amorphous semiconductor film 704 can be crystallized uniformly.

Next, the gate insulating film 705 covering the crystalline semiconductor films 704*a* to 704*d* is formed. As the gate insulating film 705, a single layer or stacked layers of a film containing an oxide of silicon or a nitride of silicon is formed by a CVD method, a sputtering method, or the like. Specifically, a film containing silicon oxide, a film containing silicon oxynitride, or a film containing silicon nitride oxide is formed in a single layer or stacked layers.

Alternatively, the gate insulating film 705 may be formed by performing the above-described high-density plasma treatment on the semiconductor films 704*a* to 704*d* to oxidize or nitride the surfaces. For example, the film is formed by plasma treatment introducing a mixed gas of a rare gas such as He, Ar, Kr or Xe and oxygen, nitrogen oxide ($NO_2$), ammonia, nitrogen, hydrogen or the like. When excitation of the plasma in this case is performed by introduction of a microwave, high density plasma can be generated with a low electron temperature. By an oxygen radical (there is a case where an OH radical is included) or a nitrogen radical (there is a case where an NH radical is included) generated by this high-density plasma, the surface of the semiconductor film can be oxidized or nitrided.

By treatment using such high-density plasma, an insulating film with a thickness of 1 to 20 nm, typically 5 to 10 nm, is formed over a semiconductor film. Since the reaction of this case is a solid-phase reaction, interface state density between the insulating film and the semiconductor film can be extremely low. Since such high-density plasma treatment oxidizes (or nitrides) a semiconductor film (crystalline silicon, or polycrystalline silicon) directly, unevenness of a thickness of the insulating film to be formed can be extremely small, ideally. In addition, oxidation is not strengthened even in a crystal grain boundary of crystalline silicon, which makes a very preferable condition. That is, by a solid-phase oxidation of the surface of the semiconductor film by the high-density plasma treatment shown here, an insulating film with good uniformity and low interface state density can be formed without causing oxidation reaction abnormally in a crystal grain boundary.

As the gate insulating film, an insulating film formed by the high-density plasma treatment may be used by itself, or an insulating film of silicon oxide, silicon oxynitride, silicon nitride or the like may be formed thereover by a CVD method using plasma or thermal reaction, so as to make stacked layers. In any case, a transistor including an insulating film formed by high-density plasma, in a part of the gate insulating film or in the whole gate insulating film, can reduce unevenness of the characteristic.

Furthermore, the semiconductor films 704*a* to 704*d* obtained by irradiating a semiconductor film with a continuous wave laser beam or a laser beam oscillated with a repetition rate of 10 MHz or more and scanning the semiconductor film in one direction for crystallization, have a characteristic that the crystal grows in the scanning direction of the beam. When a transistor is placed so that the scanning direction is aligned with the channel length direction (the direction in which carriers flow when a channel formation region is formed) and the above-described gate insulating layer is used, a thin film transistor (TFT) with fewer characteristic variation and high electron field-effect mobility can be obtained.

Next, a first conductive film and a second conductive film are stacked over the gate insulating film 705. Here, the first conductive film is formed with a thickness of 20 to 100 nm by a plasma CVD method, a sputtering method or the like, and the second conductive film is formed with a thickness of 100 to 400 nm. The first conductive film and the second conductive film are formed using an element selected from tantalum (Ta), tungsten (W), titanium (Ti), molybdenum (Mo), aluminum (Al), copper (Cu), chromium (Cr), niobium (Nb) or the like, or an alloy material or a compound material containing the above-described element as its main component. Alternatively, they are formed using a semiconductor material typified by polycrystalline silicon doped with an impurity element such as phosphorus. As examples of a combination of the first conductive film and the second conductive film, a tantalum nitride film and a tungsten film, a tungsten nitride film and a tungsten film, a molybdenum nitride film and a molybdenum film, and the like can be given. Since tungsten and tantalum nitride have high heat resistance, heat treatment for thermal activation can be performed after the first conductive film and the second conductive film are formed. In addition, in a case of a three-layer structure instead of a two-layer structure, a stacked layer structure of a molybdenum film, an aluminum film and a molybdenum film may be adopted.

Next, a resist mask is formed by a photolithography method, and etching treatment for forming a gate electrode and a gate line is performed, so that gate electrodes 707 are formed above the semiconductor films 704a to 704d.

Next, a resist mask is formed by a photolithography method, and an impurity element imparting n-type conductivity is added at a low concentration to the crystalline semiconductor films 704a to 704d, by an ion doping method or an ion implantation method. As the impurity element imparting n-type conductivity, an element which belongs to Group 15 may be used; for example, phosphorus (P) and arsenic (As) are used.

Next, an insulating film is formed so as to cover the gate insulating film 705 and the gate electrodes 707. The insulating film is formed as a single layer or stacked layers of a film containing an inorganic material such as silicon, an oxide of silicon, or a nitride of silicon, or an organic material such as an organic resin, by a plasma CVD method, a sputtering method, or the like. Next, the insulating film is selectively etched by anisotropic etching which mainly etch in a vertical direction, so that insulating films 708 (also referred to as side walls) which are in contact with side surfaces of the gate electrodes 707 are formed. The insulating films 708 are used as masks for doping when LDD (Lightly Doped drain) regions are formed later.

Figure 6C:
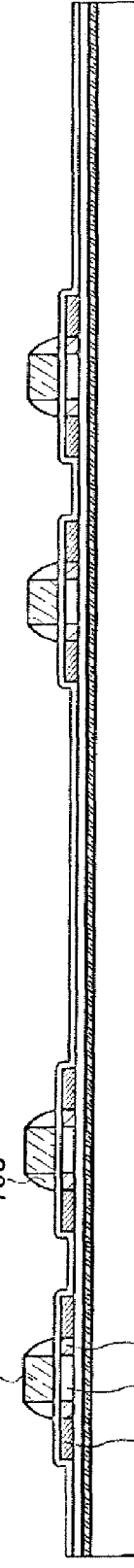

Next, using a resist mask formed by a photolithography method, the gate electrodes 707 and the insulating films 708 as masks, an impurity element imparting n-type conductivity is added to the crystalline semiconductor films 704a to 704d, so that first n-type impurity regions 706a (also referred to as LDD regions), second n-type impurity regions 706b, and channel regions 706c are formed (FIG. 6C). The concentration of the impurity element contained in the first n-type impurity regions 706a is lower than the concentration of the impurity element contained in the second n-type impurity regions 706b.

Figure 6D:
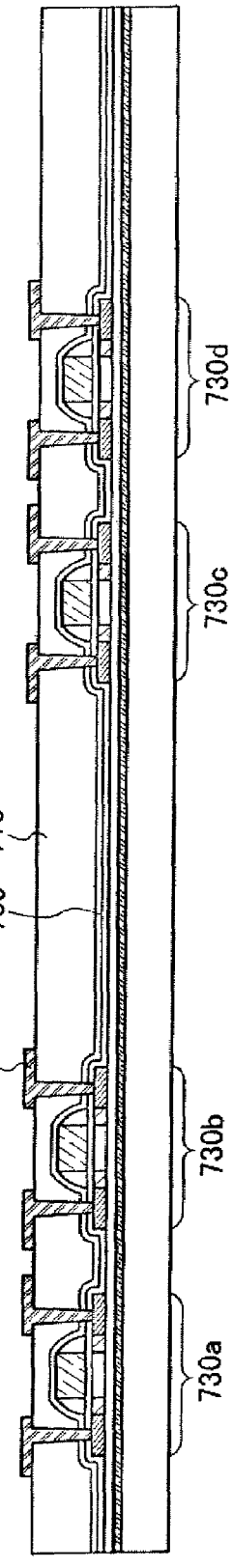

Next, an insulating film is formed as a single layer or stacked layers so as to cover the gate electrodes 707, the insulating films 708 and the like; thereby forming thin film transistors 730a to 730d (FIG. 6D). The insulating film is formed in a single layer or stacked layers using an inorganic material such as an oxide of silicon or a nitride of silicon, an organic material such as polyimide, polyamide, benzocyclobutene, acrylic, or epoxy, a siloxane material, or the like, by a CVD method, a sputtering method, an SOG method a droplet discharge method, a screen printing method, or the like. For example, in the case where the insulating film has a two-layer structure, a silicon nitride oxide film may be formed as a first insulating film 709, and a silicon oxynitride film may be formed as a second insulating film 710.

It is to be noted that before the insulating films 709 and 710 are formed or after one or more of thin films of the insulating films 709 and 710 are formed, beat treatment for recovering the crystallinity of the semiconductor film, for activating the impurity element which has been added into the semiconductor film, or for hydrogenating the semiconductor film may be performed. For the heat treatment, thermal annealing, a laser annealing method, an RTA method, or the like may be adopted.

Next, the insulating films 709 and 710, and the like are etched by a photolithography method, and contact holes are formed to expose the second n-type impurity regions 706b. Then, a conductive film is formed so as to fill the contact holes and the conductive film is selectively etched so as to form conductive films 731. It is to be noted that before forming the conductive film, a silicide may be formed over the surfaces of the semiconductor films 704a to 704d exposed at the contact holes.

The conductive film 731 is formed in a single layer or stacked layers using an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), or silicon (Si), or an alloy material or a compound material containing the above-described element as its main component by a CVD method, a sputtering method, or the like. An alloy material containing aluminum as its main component corresponds to a material which contains aluminum as its main component and also contains nickel or an alloy material which contains aluminum as its main component and which also contains nickel and one or both of carbon and silicon, for example. The conductive film 731 preferably employs, for example, a stacked layer structure of a barrier film, an aluminum-silicon (Al—Si) film and a barrier film, or a stacked layer structure of a barrier film, an aluminum-silicon (Al—Si) film, a titanium nitride (TiN) film and a barrier film. It is to be noted that a barrier film corresponds to a thin film formed by using titanium, a nitride of titanium, molybdenum, or a nitride of molybdenum. Aluminum and aluminum silicon which have low resistance and are inexpensive are optimal materials for forming the conductive film 731. In addition, generation of a hillock of aluminum or aluminum silicon can be prevented when upper and lower barrier layers are formed. Furthermore, when the barrier film is formed by using titanium that is a highly-reducible element, even if a thin natural oxide film is formed over the crystalline semiconductor film, the natural oxide film is reduced so that preferable contact with the crystalline semiconductor film can be obtained.

Next, an insulating film 711 is formed so as to cover the conductive films 731, and conductive films 712 are formed over the insulating film 711 so as to be electrically connected to the conductive films 731 (FIG. 7A). The insulating film 711 is formed in a single layer or stacked layers using an inorganic material or an organic material by a CVD method, a sputtering method, an SOG method, a droplet discharge method, a screen printing method, or the like. The insulating film 711 is preferably formed with a thickness of 0.75 to 3 μm. Furthermore, the conductive films 712 can be formed using any of the materials given for the conductive films 731.

Next, conductive films 713 are formed over the conductive films 712. The conductive films 713 are formed using a conductive material, by a CVD method, a sputtering method, a droplet discharge method, a screen printing method, or the like (FIG. 7B). Preferably, the conductive films 713 are formed in a single layer or stacked layers using an element selected from aluminum (Al), titanium (Ti), silver (Ag), copper (Cu), or gold (Au), or an alloy material or a compound material containing the above-described element as its main component. Here, a paste containing silver is formed over the conductive films 712 by a screen printing method, and then, heat treatment at 50 to 350° C. is performed; thereby forming the conductive films 713. In addition, after the conductive films 713 are formed over the conductive films 712, regions where the conductive films 713 and the conductive films 712 overlap each other may be irradiated with laser light so as to improve electrical connection thereof. It is to be noted that it is possible to selectively form the conductive films 713 over the conductive films 731 without forming the insulating film 711 and the conductive films 712.

Next, an insulating film 714 is formed so as to cover the conductive films 712 and 713, and the insulating film 714 is selectively etched by a photolithography method; thereby forming opening portions 715 that expose the conductive films 713 (FIG. 7C). The insulating film 714 is formed in a single layer or stacked layers using an inorganic material or an organic material, by a CVD method, a sputtering method, an SOG method, a droplet discharge method, a screen printing method, or the like.

Figure 8A:
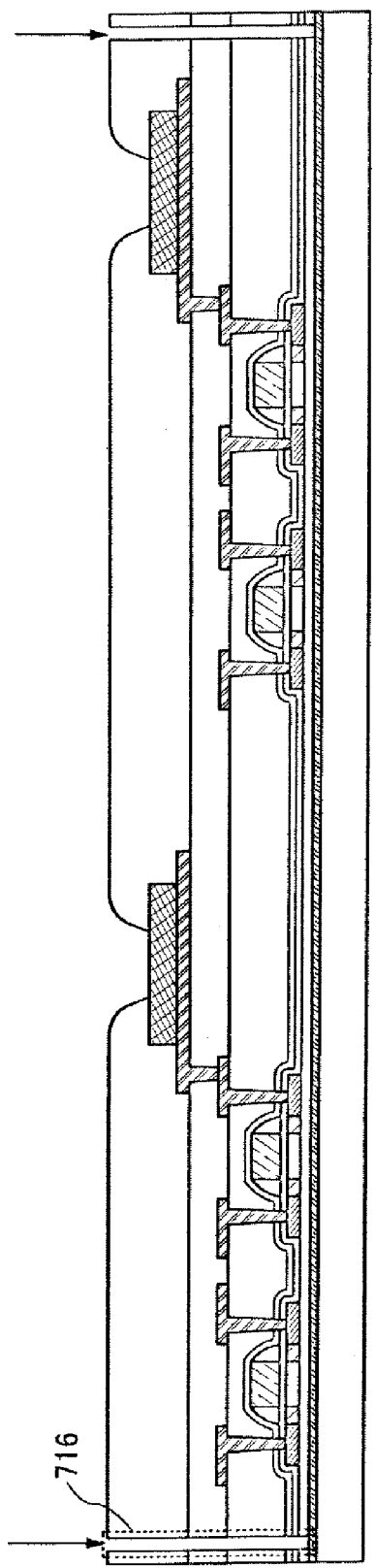
FIGS. 8A and 8B show an example of a manufacturing method of a semiconductor device, using a laser light irradiation apparatus of the present invention.

Next, a layer 732 including the thin film transistors 730a to 730d and the like (hereinafter also referred to as a "layer 732") is peeled from the substrate 701. Here, opening portions 716 are formed by laser light irradiation (such as UV light) (FIG. 8A), and then, the layer 732 can be peeled from the substrate 701 by using physical force. Alternatively, an etchant may be introduced to the opening portions 716 before peeling the layer 732 from the substrate 701; thereby removing the peeling layer 702. As the etchant, a gas or a liquid containing halogen fluoride or an interhalogen compound is used; for example, chlorine trifluoride ($ClF_3$) is used as a gas containing halogen fluoride. Accordingly, the layer 732 is peeled from the substrate 701. The peeling layer 702 may be partially left instead of being removed entirely; accordingly, consumption of the etchant can be reduced and process time for removing the peeling layer can be shortened. In addition, the layer 732 can be retained at the substrate 701 even after the peeling layer 702 is removed. In addition, it is preferable to reuse the substrate 701 after the layer 732 is peeled off, in order to reduce the cost.

Figure 8B:
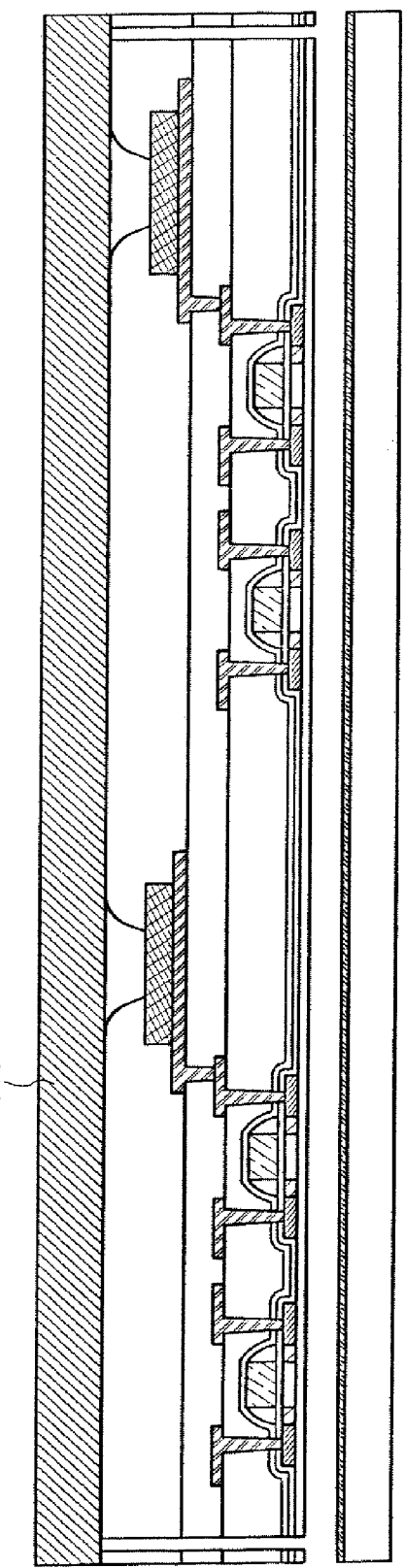

Here, after the opening portions 716 are formed by etching the insulating film by laser light irradiation, a surface of the layer 732 (a surface where the insulating film 714 is exposed) is attached to a first sheet material 717 and the layer 732 is peeled completely from the substrate 701 (FIG. 8B). As the first sheet material 717, a thermal peeling tape of which adhesiveness is lowered by heat can be used, for example.

Next, a second sheet material 718 is provided over the other surface (the surface peeled from the substrate 701) of the layer 732, and one or both of heat treatment and pressure treatment are performed to attach the second sheet material 718. Concurrently with or after providing the second sheet material 718, the first sheet material 717 is peeled (FIG. 9A). As the second sheet material 718, a hot-melt film or the like can be used. When a thermal peeling tape is used as the first sheet material 717, the peeling can be performed by using the heat applied for attaching the second sheet material 718.

As the second sheet material 718, a film on which antistatic treatment for preventing static electricity or the like is performed (hereinafter referred to as an antistatic film) may be used. As the antistatic film, a film with an antistatic material dispersed in a resin, a film with an antistatic material attached thereon, and the like can be given as examples. The film provided with an antistatic material may be a film with an antistatic material provided over one of its surfaces, or a film with an antistatic material provided over both of its surfaces. As for the film with an antistatic material provided over one of its surfaces, the film may be attached to the layer so that the antistatic material is placed on the inner side of the film or the outer side of the film. The antistatic material may be provided over the entire surface of the film, or over a part of the film. As the antistatic material here, a metal, indium tin oxide (ITO), a surfactant such as an amphoteric surfactant, a cationic surfactant, or a nonionic surfactant can be used. In addition to that, as the antistatic material, a resin material containing crosslinkable copolymer having a carboxyl group and a quaternary ammonium base on its side chain, or the like can be used. By attaching, mixing, or applying such a material to a film, an antistatic film can be formed. By providing the antistatic film, adverse effects on a semiconductor element, when the semiconductor device is dealt with as a commercial product, due to static electricity or the like from outside can be suppressed.

Next conductive films 719 are formed so as to cover the opening portions 715, and an element group 733 is formed (FIG. 9B). It is to be noted that, before or after the formation of the conductive films 719, the conductive films 712 and 713 may be irradiated with laser light so as to improve electrical connection thereof.

Next, the element group 733 is selectively irradiated with laser light so as to be divided into a plurality of element groups (FIG. 10A).

Next, the element group 733 is pressure-bonded to a substrate 721 over which a conductive film 722 functioning as an antenna is formed (FIG. 10B). Specifically, the element group 733 is attached to the substrate 721 so that the conductive film 722 functioning as an antenna formed over the substrate 721 and the conductive film 719 of the element group 733 are electrically connected to each other. Here, the substrate 721 and the element group 733 are bonded to each other by using a resin 723 having adhesiveness. In addition, the conductive film 722 and the conductive film 719 are electrically connected to each other by using a conductive particle 724 contained in the resin 723.

It is to be noted that this embodiment mode can be freely combined with the above embodiment modes. In other words, the material or the formation method described in the above embodiment modes can be used in combination also in this embodiment mode, and the material or the formation method described in this embodiment mode can be used in combination also in the above embodiment modes.

Embodiment Mode 4

Embodiment Mode 4 will describe an example of usage modes of a semiconductor device which is obtained by the manufacturing method described in the above-described Embodiment Mode 3. Specifically, applications of a semiconductor device which can input and output data without contact will be described below with reference to the drawings. The semiconductor device which can input and output data without contact is also referred to as an ID tag, an ID tag, an IC tag, an IC chip, an RF tag, a wireless tag, an electronic tag, or a wireless chip depending on application modes.

A semiconductor device 80 has a function of communicating data without contact, and includes a high frequency circuit 81, a power supply circuit 82, a reset circuit 83, a clock generation circuit 84, a data demodulation circuit 85, a data modulation circuit 86, a control circuit 87 for controlling other circuits, a memory circuit 88, and an antenna 89 (FIG.

11A). The high frequency circuit 81 is a circuit which receives a signal from the antenna 89 and make the antenna 89 output a signal received from the data modulation circuit 86. The power supply circuit 82 is a circuit which generates a power supply potential from the received signal. The reset circuit 83 is a circuit which generates a reset signal. The clock generation circuit 84 is a circuit which generates various clock signals based on the received signal input from the antenna 89. The data demodulation circuit 85 is a circuit which demodulates the received signal and outputs the signal to the control circuit 87. The data modulation circuit 86 is a circuit which modulates a signal received from the control circuit 87. As the control circuit 87, a code extraction circuit 91, a code determination circuit 92, a CRC determination circuit 93, and an output unit circuit 94 are formed, for example. It is to be noted that the code extraction circuit 91 is a circuit which separately extracts a plurality of codes included in an instruction transmitted to the control circuit 87. The code determination circuit 92 is a circuit which compares the extracted code and a code corresponding to a reference to determine the content of the instruction. The CRC determination circuit 93 is a circuit which detects the presence or absence of a transmission error or the like based on the determined code.

Next, an example of operation of the above-described semiconductor device will be explained. First, a radio signal is received by the antenna 89. The radio signal is transmitted to the power supply circuit 82 via the high frequency circuit 81, and a high power supply potential (hereinafter referred to as VDD) is generated. The VDD is supplied to each circuit included in the semiconductor device 80. In addition, a signal transmitted to the data demodulation circuit 85 via the high frequency circuit 81 is demodulated (hereinafter, a demodulated signal). Furthermore, a signal transmitted through the reset circuit 83 and the clock generation circuit 84 via the high frequency circuit 81 and the demodulated signal are transmitted to the control circuit 87. The signal transmitted to the control circuit 87 is analyzed by the code extraction circuit 91, the code determination circuit 92, the CRC determination circuit 93, and the like. Then, in accordance with the analyzed signal, information of the semiconductor device stored in the storage circuit 88 is output. The output information of the semiconductor device is encoded through the output unit circuit 94. Furthermore, the encoded information of the semiconductor device 80 is, through the data modulation circuit 86, transmitted by the antenna 89 as a radio signal. It is to be noted that a low power supply potential (hereinafter, VSS) is common among a plurality of circuits included in the semiconductor device 80, and VSS can be GND.

Thus, data of the semiconductor device can be read by transmitting a signal from a reader/writer to the semiconductor device 80 and receiving the signal transmitted from the semiconductor device 80 by the reader/writer.

In addition, the semiconductor device 80 may supply a power supply voltage to each circuit by an electromagnetic wave without a power source (battery) mounted, or by an electromagnetic wave and a power source battery) with the power source (battery) mounted.

Since a semiconductor device which can be bent can be manufactured by using the manufacturing method described in the above embodiment mode, the semiconductor device can be attached to an object having a curved surface.

Figure 11A:
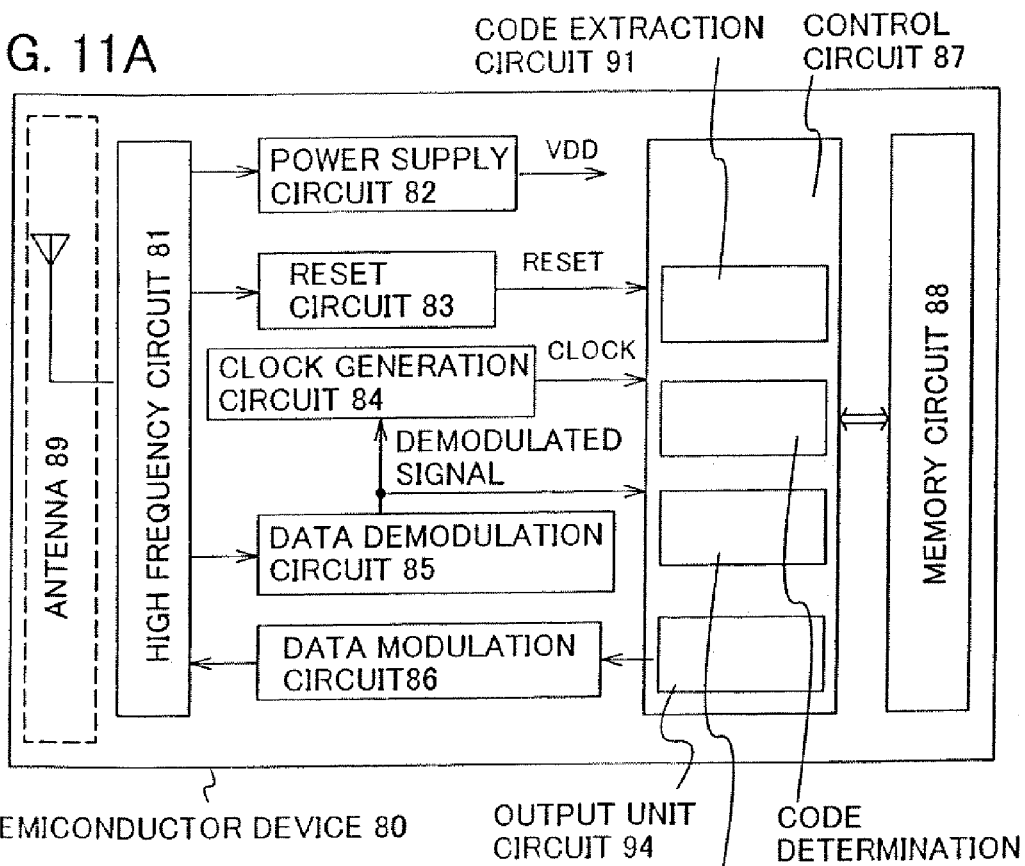
FIGS. 11A to 11C show examples of usage modes of a semiconductor device manufactured using a laser irradiation apparatus of the present invention.
Figure 11B:
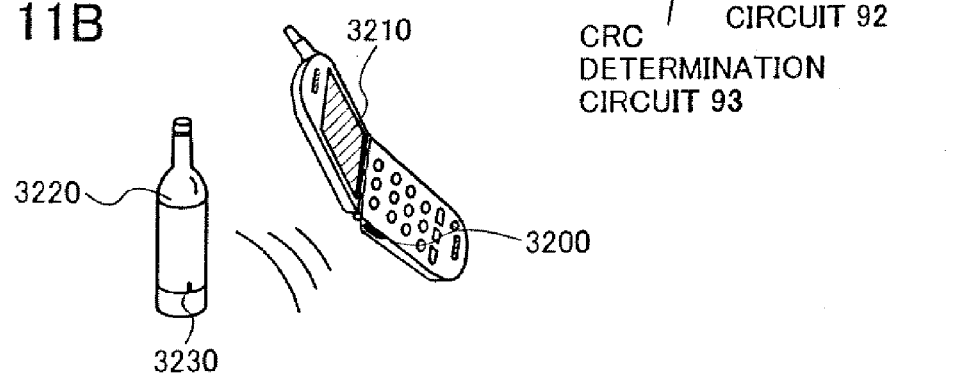
Figure 11C:
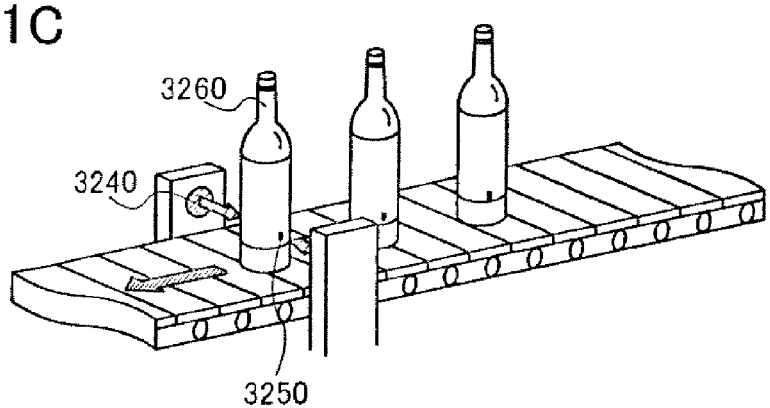

Next an example of usage modes of a flexible semiconductor device which can input and output data without contact will be explained. A side face of a portable terminal including a display portion 3210 is provided with a reader/writer 3200, and a side face of an article 3220 is provided with a semiconductor device 3230 (FIG. 11B). When the reader/writer 3200 is held over the semiconductor device 3230 included in the article 3220, information on the article 3220 such as a raw material, the place of origin, an inspection result in each production step, the history of distribution, or an explanation of the article is displayed on the display portion 3210. Furthermore, when a product 3260 is transported by a conveyor belt, the product 3260 can be inspected using a reader/writer 3240 and a semiconductor device 3250 attached to the product 3260 (FIG. 11C). Thus, by utilizing the semiconductor device in a production control System, information can be acquired easily, and improvement in functionality and added value of the system can be achieved.

In addition, as a signal transmission method in the above-described semiconductor device which can input and output data without contact, an electromagnetic coupling method, an electromagnetic induction method, a microwave method, or the like can be used. The transmission method may be arbitrarily selected by a practitioner in consideration of an intended use, and an optimum antenna may be provided in accordance with the transmission method.

In a case of employing, for example, an electromagnetic coupling method or an electromagnetic induction method (for example, 13.56 MHz band) as the signal transmission method in the semiconductor device, electromagnetic induction caused by a change in magnetic field density is used. Therefore, the conductive film functioning as an antenna is formed in an annular shape (for example, a loop antenna) or a spiral shape (for example, a spiral antenna).

Figure 13A:
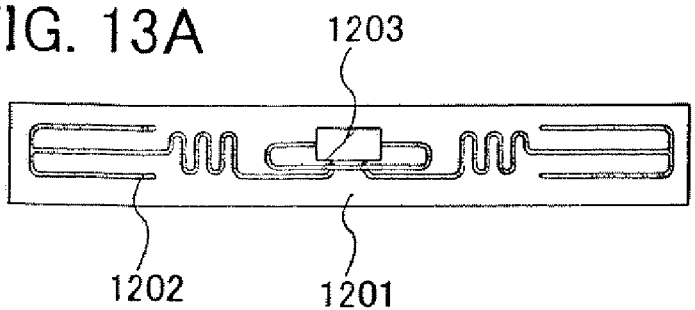
FIGS. 13A to 13D show examples of usage modes of a semiconductor device manufactured using a laser irradiation apparatus of the present invention.
Figure 13B:
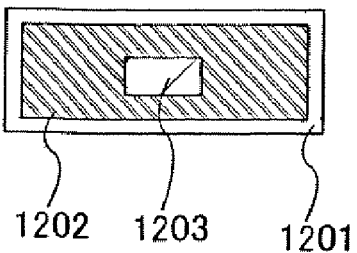
Figure 13C:
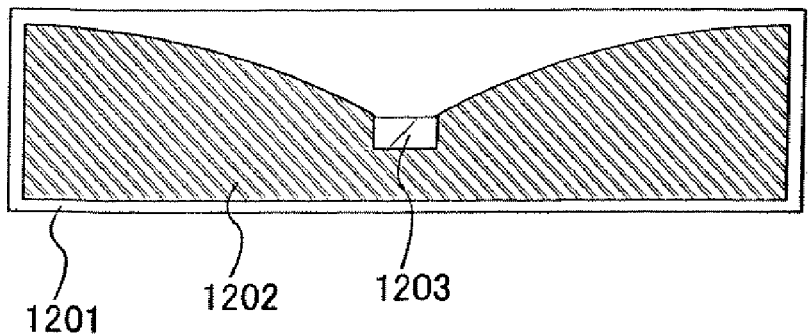
Figure 13D:
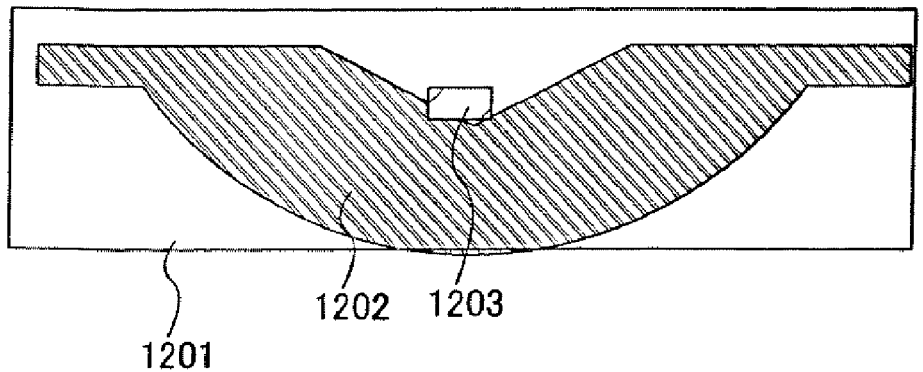

In a case of employing a microwave method (for example, UHF band (860 to 960 MHz band), a 2.45 GHz band, or the like) as the signal transmission method in the semiconductor device, the shape such as a length of the conductive film functioning as an antenna may be arbitrarily set in consideration of a wavelength of an electromagnetic wave used for signal transmission. For example, after a conductive film 1202 functioning as an antenna is formed over the substrate 1201 in a linear shape (for example, a dipole antenna (FIG. 13A)), a flat shape (for example, a patch antenna (FIG. 13B)), a ribbon-like shape (FIGS. 13C and 13D), or the like, an IC chip 1203 (integrated circuit) can be provided so as to be electrically connected to the conductive film 1202 functioning as an antenna. The shape of the conductive film 1202 functioning as an antenna is not limited to a linear shape, and the conductive film functioning as an antenna may be formed in a curved-line shape, a meander shape, or a combination thereof, in consideration of a wavelength of an electromagnetic wave.

The conductive film functioning as an antenna is formed using a conductive material by a CVD method, a sputtering method, a printing method such as screen printing or gravure printing, a droplet discharge method, a dispenser method, a plating method, or the like. The conductive film is formed with a single-layer structure or a stacked layer structure using an element selected from aluminum (Al), titanium (Ti), silver (Ag), copper (Cu), gold (Au), platinum (Pt), nickel (Ni), palladium (Pd), tantalum (Ta), or molybdenum (Mo) or an alloy material or a compound material containing the element as its main component.

In a case of forming a conductive film functioning as an antenna by, for example, a screen printing method, the conductive film can be formed by selectively printing a conductive paste in which conductive particles each having a grain size of several nm to several tens of μm are dissolved or dispersed in an organic resin. As the conductive particle, a fine particle or a dispersive nanoparticle of one or more metals of silver (Ag), gold (Au), copper (Cu), nickel (Ni), platinum (Pt), palladium (Pd), tantalum (Ta), molybdenum (Mo), and titanium (Ti) or silver halide can be used. In addition, as the organic resin contained in the conductive paste, one or a plurality of organic resins each functioning as a binder, a solvent, a dispersant, or a coating of the metal particle can be used. Typically, an organic resin such as an epoxy resin or a silicon resin can be used. When forming a conductive film, baking is preferably performed after the conductive paste is applied. For example, in a case of using fine particles (of which grain size is 1 to 100 nm inclusive) containing silver as its main component as a material of the conductive paste, a conductive film can be obtained by hardening the conductive paste by baking at a temperature of 150 to 300° C. Alternatively, fine particles containing solder or lead-free solder as its main component may be used; in this case, it is preferable to use a fine particle having a grain size of 20 μm or less. Solder or lead-free solder has an advantage such as low cost.

Besides the above-mentioned materials, ceramic, ferrite, or the like may be applied to an antenna. Furthermore, a material of which dielectric constant and magnetic permeability are negative in a microwave band (metamaterial) can be applied to an antenna.

In a case of applying an electromagnetic coupling method or an electromagnetic induction method, and placing a semiconductor device including an antenna in contact with a metal, a magnetic material having magnetic permeability is preferably provided between the semiconductor device and the metal. In the case of placing a semiconductor device including an antenna in contact with a metal, an eddy current flows in the metal accompanying change in a magnetic, field, and a demagnetizing field generated by the eddy current impairs a change in a magnetic field and decreases a communication range. Therefore, an eddy current of the metal and a decrease in the communication range can be suppressed by providing a material having magnetic permeability between the semiconductor device and the metal. It is to be noted that ferrite or a metal thin film having high magnetic permeability and little loss of high frequency wave can be used as the magnetic material.

It is to be noted that an applicable range of the flexible semiconductor device is wide in addition to the above, and the flexible semiconductor device can be applied to any product as long as it is a product whose production, management, or the like can be supported by carrying information such as the history of an object without contact. For example, the semiconductor device can be mounted on paper money, coins, securities, certificates, bearer bonds, packing containers, books, recording media, personal belongings, vehicles, food, clothing, health products, commodities, medicine, electronic devices, and the like. Examples of them will be explained with reference to FIGS. 12A to 12H.

Figure 12A:
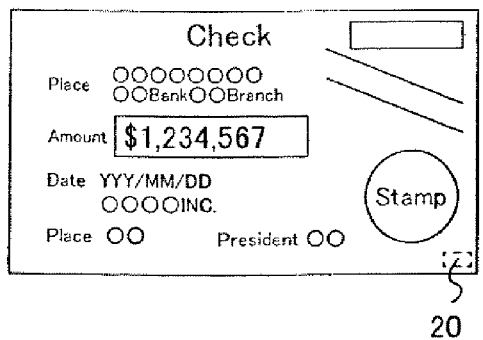
FIGS. 12A to 12H show examples of usage modes of a semiconductor device manufactured using a laser irradiation apparatus of the present invention.
Figure 12B:
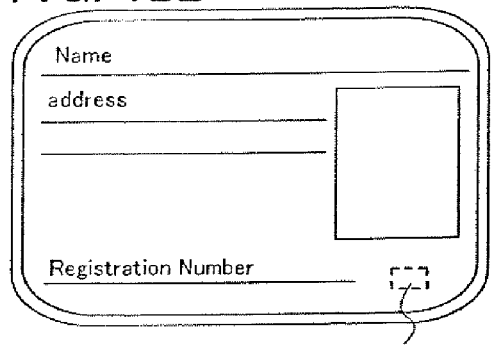
Figure 12C:
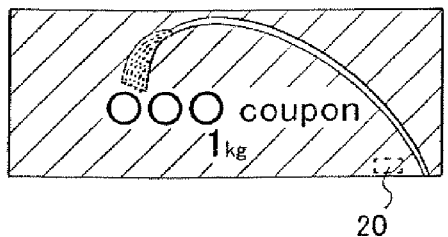
Figure 12D:
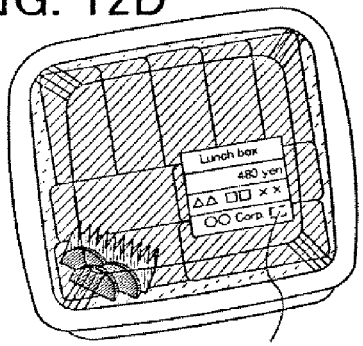
Figure 12E:
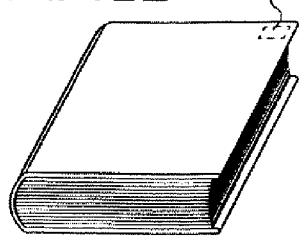
Figure 12F:
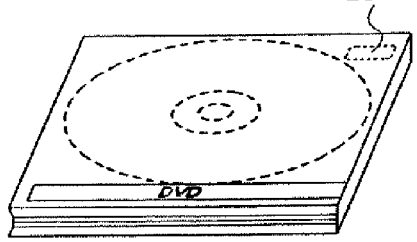
Figure 12G:
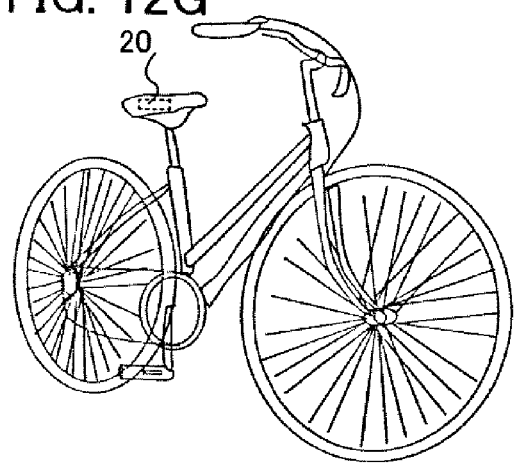
Figure 12H:
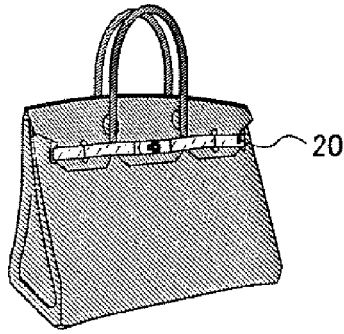

The paper money and coins are money distributed to the market, and include one valid in a certain area (cash voucher), memorial coins, and the like. The securities refer to checks, certificates, promissory notes, and the like (FIG. 12A). The certificates refer to driver's licenses, certificates of residence, and the like (FIG. 12B). The bearer bonds refer to stamps, nice coupons, various gift certificates, and the like (FIG. 12C). The packing containers refer to wrapping paper for food containers and the like, plastic bottles, and the like (FIG. 12D). The books refer to hardbacks, paperbacks, and the like (FIG. 12E). The recording media refer to DVD software, video tapes, and the like (FIG. 12F). The vehicles refer to wheeled vehicles such as bicycles, ships, and the like (FIG. 12G). The personal belongings refer to bags, glasses, and the like (FIG. 12H). The food refers to food articles, drink, and the like. The clothing refers to clothes, footwear, and the like. The health products refer to medical instruments, health instruments, and the like. The commodities refer to furniture, lighting equipment, and the like. The medicine refers to medical products, pesticides, and the like. The electronic devices refer to liquid crystal display devices, EL display devices, television devices (TV sets, flat-screen TV sets), cellular phones, and the like.

Forgery can be prevented by providing the semiconductor device 20 to the paper money, the coins, the securities, the certificates, the bearer bonds, or the like. The efficiency of an inspection system, a system used in a rental shop, or the like can be improved by providing the semiconductor device 20 to the packing containers, the books, the recording media, the personal belongings, the food, the commodities, the electronic devices, or the like. Forgery or theft can be prevented by providing the semiconductor device 20 to the vehicles, the health products, the medicine, or the like; further, in the case of the medicine, medicine can be prevented from being taken mistakenly. The semiconductor device 20 can be provided to the foregoing article by being attached to the surface or being embedded therein. For example, in the case of a book, the semiconductor device 20 may be embedded in a piece of paper; in the case of a package made from an organic resin, the semiconductor device 20 may be embedded in the organic resin. Even when the semiconductor device having flexibility is provided to paper or the like, breakage or the like of an element included in the semiconductor device can be prevented by using the structure described in the above embodiment modes.

As described above, the efficiency of an inspection system, a system used in a rental shop, or the like can be improved by providing the semiconductor device to the packing containers, the recording media, the personal belonging, the food, the clothing, the commodities, the electronic devices, or the like. In addition, by providing the semiconductor device to the vehicles, forgery or theft can be prevented. Further, by implanting the semiconductor device in a creature such as an animal, an individual creature can be easily identified. For example, by implanting the semiconductor device with a sensor in a creature such as livestock, its health condition such as a current body temperature as well as its birth year, sex, breed, or the like can be easily managed.

It is to be noted that this embodiment mode can be freely combined with the above embodiment modes. In other words, the material or the formation method described in the above embodiment modes can be used in combination also in this embodiment mode, and the material or the formation method described in this embodiment mode can be used in combination also in the above embodiment modes.

Embodiment 1

Embodiment 1 will describe calculation results in the case where the laser oscillator, the correction lens and the beam expander optical system are disposed as shown in FIG. 1 and where the beam expander optical system is moved with respect to the point, at which an image at the emission point of the laser oscillator is formed by the correction lens.

Figure 14:
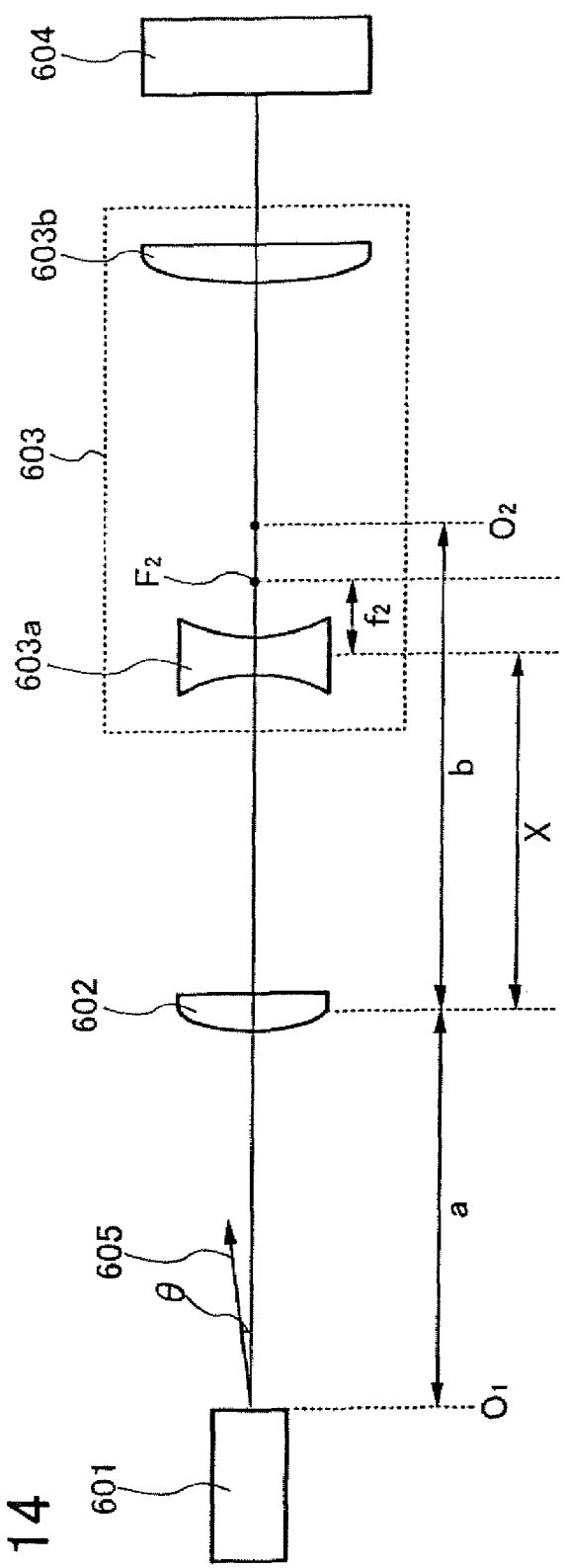
FIG. 14 shows a structure used for calculation of a laser light irradiation apparatus of the present invention.

First, an optical system as shown in FIG. 14, in which a laser oscillator 601, a correction lens 602, a concave lens 603a and a convex lens 603b forming a beam expander optical system 603, and an irradiation object 604 are disposed in order in a traveling direction of laser light oscillated from the laser oscillator 601, is assumed. In the case where laser light 605 was oscillated in a direction an angle θ deviated from a horizontal direction from the laser oscillator 601, the calculation for the irradiation position of laser light with which the irradiation object 604 was irradiated when the position of the concave lens 603a (the distance X between the correction lens 602 and the concave lens 603a) was changed, was conducted Note that irradiation positions were compared with an irradiation position with θ=0° as a reference.

In the case where the laser light 605 oscillated from the laser oscillator 601 entered the concave lens 603a through the correction lens 602, when an emission point (or a beam W or a light source) of the laser oscillator 601 was a first conjugate point $O_1$, a point at which an image at the first conjugate point $O_1$ was formed through the correction lens 602 was a second conjugate point $O_2$, a distance between the first conjugate point $O_1$ and the correction lens 602 was a, a distance between the correction lens 602 and the second conjugate point $O_2$ was b, and a focal length of the concave lens 603a was $f_2$, the calculation was conducted with a=b=500 mm and $f_2$=10.3 mm. The distance between the concave lens 603a and the convex lens 603b was kept fixed.

In addition, the calculation was conducted on the assumption that the curvature radiuses of the correction lens 602, the concave lens 603a and the convex lens 603b were 137 mm, 11.37 mm and 271.5 mm respectively and the thicknesses of the correction lens 602, the concave lens 603a and the convex lens 603b were 2.7 mm, 2.55 mm and 5.1 mm respectively.

First, a calculation result in the case θ=0.0017° is shown in Table 1. This value was set in consideration of an error of an emission angle of laser light oscillated from the laser oscillator 601, which was caused by the state of use circumstance such as temperature change when the laser oscillator, the correction lens and the beam expander optical system were actually disposed as shown in FIG. 14.

TABLE 1

| | X (mm) | Displacement (mm) |
|---|---|---|
| 1 | 450 | 0.030 |
| 2 | 470 | 0.016 |
| 3 | 490 | 0.001 |
| 4 | 510 | −0.014 |
| 5 | 530 | −0.028 |

θ = 0.0017°

From Table 1, in the case of θ=0.0017°, the displacement of the irradiation position of the laser light with which an irradiation object is irradiated can be considered to be sufficiently small when X is in the range of 470 mm to 490 mm inclusive, that is, when the second conjugate point $O_2$ is in the range of $2f_2$ in a traveling direction of the laser light and the direction opposite to the traveling direction from a focal point $F_2$ of the concave lens 603a.

Further, in the case of X=490 mm (where the second conjugate point $O_2$ and the focal point $F_2$ of the concave lens 603a roughly overlap), the result was obtained that the amount of displacement of the irradiation position of the laser light to the irradiation object was the smallest.

Next, the calculation result in the case where the emission angle of the laser light oscillated from the laser oscillator 601 was largely deviated (here, θ=1°) is shown in Table 2.

TABLE 2

| | X (mm) | Displacement (mm) |
|---|---|---|
| 1 | 450 | 17.112 |
| 2 | 470 | 8.321 |
| 3 | 490 | −0.382 |
| 4 | 510 | −9.064 |
| 5 | 530 | −17.793 |

θ = 1°

From Table 2, in the case of θ=1°, the result was obtained that the displacement of the irradiation position of the laser light to the irradiation object 604 was increased as the distance between the second conjugate point $O_2$ and the focal point $F_2$ of the concave lens 603a was increased (as an incidence position at the concave lens 603a was displaced more). However, in the case of X=490 mm where the second conjugate point $O_2$ and the focal point $F_2$ of the concave lens 603a almost overlapped, the result was obtained that the amount of displacement of the irradiation position of the laser light to the irradiation object 604 became sufficiently small. In other words, even when the emission angle of the laser light oscillated from the laser oscillator 601 is largely deviated, by providing the concave lens 603a so as to roughly overlap the second conjugate point $O_2$, the displacement of the irradiation position of the laser light on the irradiation object 604 can be reduced.

From the above-described calculation results, even when the emission angle θ from the laser oscillator 601 is changed, the displacement of the irradiation position of laser light becomes sufficiently small when the second conjugate point $O_2$ is in the range of $2f_2$ in a traveling direction of the laser light and the direction opposite to the traveling direction from the focal point $F_2$ of the concave lens 603a. Further, when the second conjugate point $O_2$ and the focal point $F_2$ of the concave lens 603a roughly overlap, the displacement of the irradiation position of the laser light to the irradiation object becomes the smallest. Accordingly, by reducing the displacement of the incidence position of laser light to a beam expander optical system by providing a correction lens between a laser oscillator and the beam expander optical system, the displacement of the irradiation position of the laser light to an irradiation object can be reduced.

Next, results of the case (FIG. 15) where a convex lens 613a is substituted for the concave lens 603a of FIG. 14, which was calculated similarly, will be described. The calculation was conducted with a curvature radius of the convex lens 613a of 11.37 mm and a thickness of 2.55 mm and a focal length $f_2$ of the convex lens 613a of 10.3 mm. Other conditions were set similar to those of FIG. 14.

Figure 15:
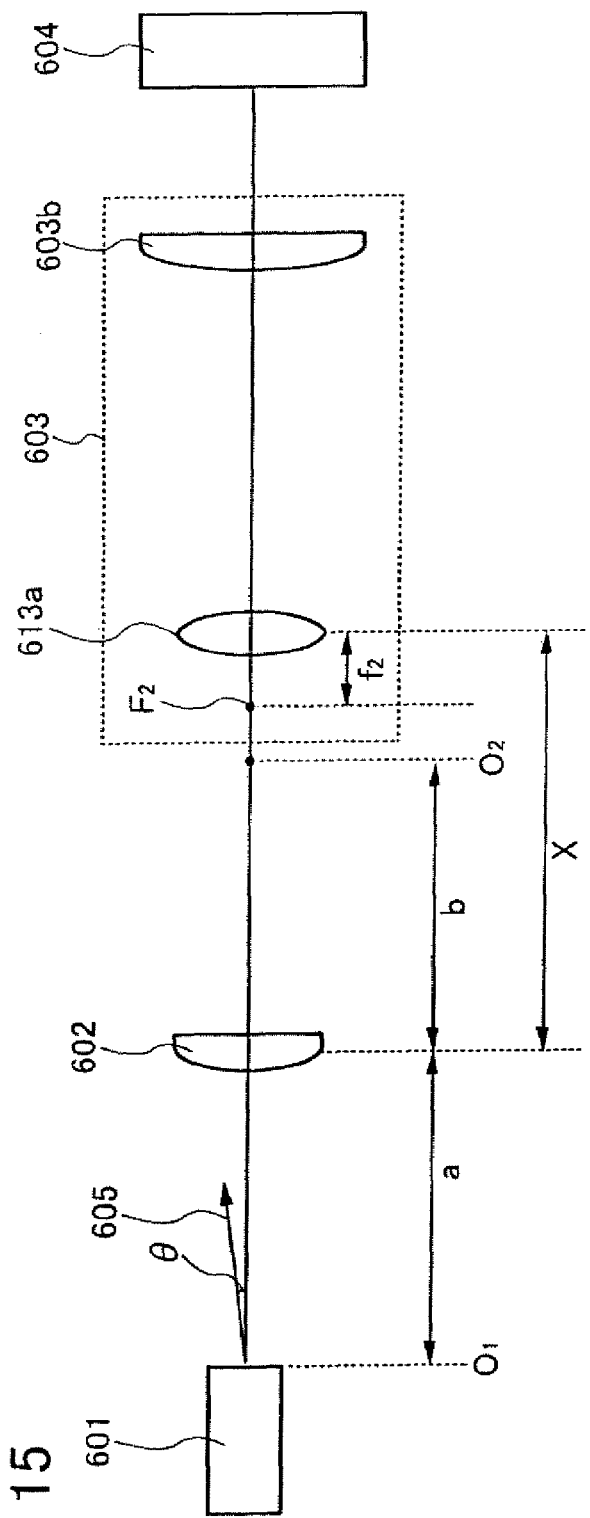
FIG. 15 shows a structure used for calculation of a laser light irradiation apparatus of the present invention.

First, a calculation result of the case of θ=0.0017° is shown in Table 3. This value was set in consideration of an error of an emission angle of laser light oscillated from the laser oscillator 601, which was caused by the state of use circumstance such as temperature change when the laser oscillator, the correction lens and the beam expander optical system were actually disposed as shown in FIG. 15.

TABLE 3

| | X (mm) | Displacement (mm) |
|---|---|---|
| 1 | 470 | −0.027 |
| 2 | 490 | −0.014 |
| 3 | 510 | −0.002 |
| 4 | 530 | 0.011 |
| 5 | 550 | 0.024 |

θ = 0.0017°

From Table 3, in the case of θ=0.0017°, the amount of displacement of the irradiation position of the laser light to an irradiation object can be considered to be sufficiently small when X is in the range of 490 mm to 530 mm inclusive, that is, when the second conjugate point $O_2$ is in the range of $2f_2$ in a traveling direction of the laser light and the direction opposite to the traveling direction from the focal point $F_2$ of the convex lens 613a.

Further, in the case of X=510 mm (where the second conjugate point $O_2$ and the focal point $F_2$ of the convex lens 613a roughly overlapped), the result was obtained that the amount of displacement of the irradiation position of the laser light to the irradiation object was the smallest.

Next, a calculation result in the case where the emission angle of the laser light oscillated from the laser oscillator 601 was largely deviated (here, θ=1°) is shown in Table 4.

TABLE 4

|   | X (mm) | Displacement (mm) |
|---|---|---|
| 1 | 470 | −15.004 |
| 2 | 490 | −7.484 |
| 3 | 510 | 0.006 |
| 4 | 530 | 7.519 |
| 5 | 550 | 15.109 |

θ = 1°

From Table 4, in the case of θ=1°, the result was obtained that the displacement of the irradiation position of the laser light was increased as the distance between the second conjugate point $O_2$ and the focal point $F_2$ of the convex lens 613a was increased (as an incidence position at the convex lens 613a was displaced more). However, in the case of X=510 mm where the second conjugate point $O_2$ and the focal point $F_2$ of the convex lens 613a almost overlapped, the result was obtained that the amount of displacement of the irradiation position of the laser light to the irradiation object 604 became sufficiently small. In other words, even when the emission angle of the laser light oscillated from the laser oscillator 601 is largely deviated, by providing the convex lens 613a so as to roughly overlap the second conjugate point $O_2$, the displacement of the irradiation position of the laser light on the irradiation object 604 can be reduced.

From the above-described calculation results, even when the emission angle θ from the laser oscillator 601 is changed, the displacement of the irradiation position of laser light becomes sufficiently small when the second conjugate point $O_2$ is in the range of $2f_2$ in a traveling direction of the laser light and the direction opposite to the traveling direction from the focal point $F_2$ of the convex lens 613a. Further, when the second conjugate point $O_2$ and the focal point $F_2$ of the convex lens 613a roughly overlap, the displacement of the irradiation position of the laser light to the irradiation object becomes the smallest. Accordingly, by reducing the displacement of the incidence position of laser light to a beam expander optical system by providing a correction lens between a laser oscillator and the beam expander optical system, the displacement of the irradiation position of the laser light to an irradiation object can be reduced.

This application is based on Japanese Patent Application serial no. 2006-005210 filed in Japan Patent Office on Jan. 12, 2006, the entire contents of which are hereby incorporated by reference.

What is claimed is:

1. A laser light irradiation apparatus comprising:
   a laser;
   a beam expander optical system which laser light oscillated from the laser enters; and
   a cylindrical lens disposed between the laser and the beam expander optical system, wherein
   the beam expander optical system includes a concave lens, and
   when an emission point of the laser is a first conjugate point, a point at which an image at the first conjugate point is formed through the cylindrical lens is a second conjugate point, a distance between the cylindrical lens and the second conjugate point is b, a focal length of the concave lens is f, and a distance between the cylindrical lens and the concave lens is X, the X satisfies $b-3|f| \leq X \leq b+|f|$.

2. The laser light irradiation apparatus according to claim 1, wherein the X preferably satisfies approximately $X=b-|f|$.

3. The laser light irradiation apparatus according to claim 1, wherein the beam expander optical system further includes a convex lens so that the concave lens and the convex lens are provided in order in a traveling direction of the laser light.

4. The laser light irradiation apparatus according to claim 1, further comprising a diffractive optical element which the laser light having passed through the beam expander optical system enters.

5. The laser light irradiation apparatus according to claim 4, wherein a condensing lens is provided on the diffractive optical element.

6. A laser light irradiation apparatus comprising:
   a laser;
   a beam expander optical system which laser light oscillated from the laser enters; and
   a cylindrical lens disposed between the laser and the beam expander optical system, wherein
   the beam expander optical system includes a first convex lens, and
   when an emission point of the laser is a first conjugate point, a point at which an image at the first conjugate point is formed through the cylindrical lens is a second conjugate point, a distance between the cylindrical lens and the second conjugate point is b, a focal length of the first convex lens is f, and a distance between the cylindrical lens and the first convex lens is X, the X satisfies $b-|f| \leq X \leq b+3|f|$.

7. The laser light irradiation apparatus according to claim 6, wherein the X preferably satisfies approximately $X=b+|f|$.

8. The laser light irradiation apparatus according to claim 6, wherein the beam expander optical system further includes a second convex lens so that the first convex lens and the second convex lens are provided in order in a traveling direction of the laser light.

9. The laser light irradiation apparatus according to claim 6, further comprising a diffractive optical element which the laser light having passed through the beam expander optical system enters.

10. The laser light irradiation apparatus according to claim 9, wherein a condensing lens is provided on the diffractive optical element.

11. A laser light irradiation method comprising the steps of:
    emitting laser light from a laser; and
    making the laser light enter a beam expander optical system including a concave lens through a cylindrical lens, wherein
    the laser, the cylindrical lens and the concave lens are disposed so that, when an emission point of the laser is a first conjugate point, a point at which an image at the first conjugate point is formed through the cylindrical lens is a second conjugate point, a distance between the cylindrical lens and the second conjugate point is b, a focal length of the concave lens is f, and a distance between the cylindrical lens and the concave lens is X, the X satisfies $b-3|f| \leq X \leq b+|f|$.

12. The laser light irradiation method according to claim 11, wherein irradiation of the laser light is conducted with a distance between the laser and the concave lens of 0.5 m or more.

13. The laser light irradiation method according to claim 11, wherein the X preferably satisfies approximately X=b−|f|.

14. The laser light irradiation method according to claim 11, wherein the beam expander optical system further includes a convex lens so that the concave lens and the convex lens are provided in order in a traveling direction of the laser light.

15. The laser light irradiation method according to claim 11, further comprising the step of making the laser light having passed through the concave lens enter a diffractive optical element.

16. The laser light irradiation method according to claim 15, wherein a condensing lens is provided on the diffractive optical element.

17. A laser light irradiation method comprising the steps of:
emitting laser light from a laser; and
making the laser light enter a beam expander optical system including a first convex lens through a cylindrical lens, wherein
the laser, the cylindrical lens and the first convex lens are disposed so that, when an emission point of the laser is a first conjugate point, a point at which an image at the first conjugate point is formed through the cylindrical lens is a second conjugate point, a distance between the cylindrical lens and the second conjugate point is b, a focal length of the first convex lens is f, and a distance between the cylindrical lens and the first convex lens is X, the X satisfies b−|f|≦X≦b+3|f|.

18. The laser light irradiation method according to claim 17, wherein irradiation of the laser light is conducted with a distance between the laser and the first convex lens of 0.5 m or more.

19. The laser light irradiation method according to claim 17, wherein the X preferably satisfies approximately X=b+|f|.

20. The laser light irradiation method according to claim 17, wherein the beam expander optical system further includes a second convex lens so that the first convex lens and the second convex lens are provided in order in a traveling direction of the laser light.

21. The laser light irradiation method according to claim 17, further comprising the step of making the laser light having passed through the first convex lens enter a diffractive optical element.

22. The laser light irradiation method according to claim 21, wherein a condensing lens is provided on the diffractive optical element.

23. A method for manufacturing a semiconductor device, comprising the steps of:
forming a semiconductor film over a substrate; and
irradiating the semiconductor film with laser light, wherein
the laser light is emitted from a laser and passes through a cylindrical lens and a beam expander optical system including a concave lens which are provided in order in a traveling direction of the laser light, and
the laser, the cylindrical lens and the concave lens are disposed so that, when an emission point of the laser is a first conjugate point, a point at which an image at the first conjugate point is formed through the cylindrical lens is a second conjugate point, a distance between the cylindrical lens and the second conjugate point is b, a focal length of the concave lens is f, and a distance between the cylindrical lens and the concave lens is X, the X satisfies b−3|f|≦X≦b+|f|.

24. The method for manufacturing a semiconductor device according to claim 23, wherein irradiation of the laser light is conducted with a distance between the laser and the concave lens of 0.5 m or more.

25. The method for manufacturing a semiconductor device according to claim 23, wherein the X preferably satisfies approximately X=b−|f|.

26. The method for manufacturing a semiconductor device according to claim 23, wherein the beam expander optical system further includes a convex lens so that the concave lens and the convex lens are provided in order in a traveling direction of the laser light.

27. The method for manufacturing a semiconductor device according to claim 23, wherein the laser light to be irradiated to the semiconductor film is further passed through a diffractive optical element.

28. The method for manufacturing a semiconductor device according to claim 27, wherein a condensing lens is provided on the semiconductor film side of the diffractive optical element.

29. The method for manufacturing a semiconductor device according to claim 23, wherein a spot of the laser light on the semiconductor film has a linear or rectangular shape.

30. A method for manufacturing a semiconductor device, comprising the steps of:
forming a semiconductor film over a substrate; and
irradiating the semiconductor film with laser light, wherein
the laser light is emitted from a laser and passes through a cylindrical lens and a beam expander optical system including a first convex lens which are provided in order in a traveling direction of the laser light, and
the laser, the cylindrical lens and the first convex lens are disposed so that, when an emission point of the laser is a first conjugate point, a point at which an image at the first conjugate point is formed through the cylindrical lens is a second conjugate point, a distance between the cylindrical lens and the second conjugate point is b, a focal length of the first convex lens is f, and a distance between the cylindrical lens and the first convex lens is X, the X satisfies b−|f|≦X≦b+3|f|.

31. The method for manufacturing a semiconductor device according to claim 30, wherein irradiation of the laser light is conducted with a distance between the laser and the first convex lens of 0.5 m or more.

32. The method for manufacturing a semiconductor device according to claim 30, wherein the X preferably satisfies approximately X=b+|f|.

33. The method for manufacturing a semiconductor device according to claim 30, wherein the beam expander optical system further includes a second convex lens so that the first convex lens and the second convex lens are provided in order in a traveling direction of the laser light.

34. The method for manufacturing a semiconductor device according to claim 30, wherein the laser light to be irradiated to the semiconductor film is further passed through a diffractive optical element.

35. The method for manufacturing a semiconductor device according to claim 34, wherein a condensing lens is provided on the semiconductor film side of the diffractive optical element.

36. The method for manufacturing a semiconductor device according to claim 30, wherein a spot of the laser light on the semiconductor film has a linear or rectangular shape.

* * * * *